(12) United States Patent
Parker et al.

(10) Patent No.: US 12,013,282 B2
(45) Date of Patent: Jun. 18, 2024

(54) TECHNIQUES FOR ALTERNATE PRESSURE EQUALIZATION OF A SENSOR

(71) Applicant: INVENSENSE, INC., San Jose, CA (US)

(72) Inventors: Jeremy Parker, Chelmsford, MA (US); Kieran Harney, Andover, MA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 17/818,820

(22) Filed: Aug. 10, 2022

(65) Prior Publication Data

US 2022/0381605 A1    Dec. 1, 2022

Related U.S. Application Data

(63) Continuation of application No. 16/543,286, filed on Aug. 16, 2019, now Pat. No. 11,467,025.

(Continued)

(51) Int. Cl.
*G01H 3/00*     (2006.01)
*B81B 3/00*     (2006.01)
(Continued)

(52) U.S. Cl.
CPC .............. *G01H 3/00* (2013.01); *B81B 3/0018* (2013.01); *B81B 7/0061* (2013.01);
(Continued)

(58) Field of Classification Search
CPC ........ G01H 11/06; G01H 3/00; H04R 19/005; H04R 31/006; H04R 2201/003; B81B 2201/0257; B81B 3/0018; B81B 7/0061
See application file for complete search history.

(56) References Cited

U.S. PATENT DOCUMENTS 3,646,281 A    2/1972  McGunigle
5,452,268 A    9/1995  Bernstein
(Continued)

FOREIGN PATENT DOCUMENTS

CN    101816187    8/2010
CN    105611012    5/2016
(Continued)

OTHER PUBLICATIONS

Non-Final Office Action received for U.S. Appl. No. 14/500,854 dated Oct. 19, 2016, 25 pages.
(Continued)

*Primary Examiner* — David L Singer
(74) *Attorney, Agent, or Firm* — Amin, Turocy & Watson, LLP

(57) ABSTRACT

An alternate venting path can be employed in a sensor device for pressure equalization. A sensor component of the device can comprise a diaphragm component and/or backplate component disposed over an acoustic port of the device. The diaphragm component can be formed with no holes to prevent liquid or particles from entering a back cavity of the device, or gap between the diaphragm component and backplate component. A venting port can be formed in the device to create an alternate venting path to the back cavity for pressure equalization for the diaphragm component. A venting component, comprising a filter, membrane, and/or hydrophobic coating, can be associated with the venting port to inhibit liquid and particles from entering the back cavity via the venting port, without degrading performance of the device. The venting component can be designed to achieve a desired low frequency corner of the sensor frequency response.

14 Claims, 11 Drawing Sheets

Related U.S. Application Data

(60) Provisional application No. 62/765,083, filed on Aug. 17, 2018.

(51) Int. Cl.
  *B81B 7/00*  (2006.01)
  *G01H 11/06*  (2006.01)
  *H04R 19/00*  (2006.01)
  *H04R 31/00*  (2006.01)

(52) U.S. Cl.
  CPC ...... *B81B 2201/0257* (2013.01); *G01H 11/06* (2013.01); *H04R 19/005* (2013.01); *H04R 31/006* (2013.01); *H04R 2201/003* (2013.01)

(56) References Cited

U.S. PATENT DOCUMENTS

| | | |
|---|---|---|
| 2005/0207605 A1 | 9/2005 | Dehe et al. |
| 2008/0039027 A1 | 2/2008 | Mohammadi |
| 2008/0185669 A1 | 8/2008 | Kok et al. |
| 2009/0290741 A1 | 11/2009 | Daley et al. |
| 2010/0046780 A1 | 2/2010 | Song |
| 2010/0054495 A1 | 3/2010 | Harney et al. |
| 2011/0075865 A1 | 3/2011 | Yang et al. |
| 2011/0272769 A1 | 11/2011 | Song et al. |
| 2012/0025334 A1 | 2/2012 | Chan et al. |
| 2013/0065343 A1 | 3/2013 | Yang et al. |
| 2013/0075836 A1 | 3/2013 | Lee |
| 2013/0223023 A1 | 8/2013 | Dehe et al. |
| 2013/0263996 A1 | 10/2013 | Holliday |
| 2014/0044297 A1 | 2/2014 | Loeppert et al. |
| 2014/0133685 A1 | 5/2014 | Liu et al. |
| 2014/0264650 A1 | 9/2014 | Liu et al. |
| 2014/0283691 A1 | 9/2014 | Furuuchi |
| 2014/0307909 A1* | 10/2014 | Yang .................. H04R 19/04 381/369 |
| 2015/0014796 A1 | 1/2015 | Dehe |
| 2015/0125003 A1 | 5/2015 | Wiesbauer et al. |
| 2015/0158722 A1 | 6/2015 | Lim et al. |
| 2015/0163572 A1 | 6/2015 | Weiss et al. |
| 2016/0091378 A1 | 3/2016 | Tsai et al. |
| 2016/0142829 A1 | 5/2016 | Murad et al. |
| 2016/0182992 A1 | 6/2016 | Munro et al. |
| 2016/0277844 A1 | 9/2016 | Kopetz et al. |
| 2016/0330550 A1 | 11/2016 | Berger et al. |
| 2016/0337761 A1* | 11/2016 | Hall .................. H04R 17/02 |
| 2017/0041692 A1 | 2/2017 | Watson et al. |
| 2017/0164084 A1 | 6/2017 | Vitt et al. |
| 2017/0374442 A1 | 12/2017 | Pennock et al. |
| 2018/0044167 A1* | 2/2018 | Jenkins .................. B81B 7/0061 |
| 2018/0103324 A1 | 4/2018 | Yoo |
| 2018/0167723 A1 | 6/2018 | Wang et al. |
| 2018/0215609 A1 | 8/2018 | Agashe et al. |
| 2019/0230446 A1* | 7/2019 | Schultz .................. H04R 19/04 |
| 2020/0169818 A1 | 5/2020 | Rombach et al. |

FOREIGN PATENT DOCUMENTS

| | | |
|---|---|---|
| CN | 105519137 | 6/2020 |
| CN | 111479179 | 12/2021 |
| DE | 102018200190 | 7/2019 |
| JP | 2008256433 | 10/2008 |
| KR | 20180092188 | 8/2018 |
| WO | 9521512 | 8/1995 |
| WO | 2006090545 | 8/2006 |
| WO | 2009116957 | 9/2009 |
| WO | 2019011720 | 1/2019 |

OTHER PUBLICATIONS

Final Office Action received for U.S. Appl. No. 14/500,854 dated May 4, 2017, 22 pages.
Non-Final Office Action received for U.S. Appl. No. 14/500,854 dated Sep. 7, 2017, 19 pages.
Kutiruff, Heinrich. "Acoustics An Introduction—Chapter 18. Microphones" CRC Press, Jan. 1, 2006, retrieved on Nov. 9, 2015, 24 pages.
International Search Report and Written Opinion for PCT Application No. PCT/US2015/049209, dated Nov. 20, 2015, 13 pages.
Non-Final Office Action received for U.S. Appl. No. 16/543,286 dated Oct. 7, 2021, 234 pages.
Final Office Action received for U.S. Appl. No. 16/543,286 dated Feb. 23, 2022, 239 pages.
Notice of Allowance received for U.S. Appl. No. 16/543,286 dated Jun. 2, 2022, 315 pages.
"Gentex Boom Microphone—M162—Noise Cancelling Amplified Electret Microphone" https://shop.gentexcorp.com/gentex-boom-microphone-m162/, retrieved on Dec. 3, 2019, 5 pages.

* cited by examiner

TECHNIQUES FOR ALTERNATE PRESSURE EQUALIZATION OF A SENSOR

CROSS-REFERENCE TO RELATED APPLICATION

This application is a continuation of, and claims priority to each of, U.S. patent application Ser. No. 16/543,286, filed on Aug. 16, 2019, and entitled "TECHNIQUES FOR ALTERNATE PRESSURE EQUALIZATION OF A SENSOR," which claims priority to U.S. Provisional Patent Application Ser. No. 62/765,083, filed on Aug. 17, 2018, and entitled "Invention Disclosure ID-4: Sealed Microphone," the entireties of which applications are hereby incorporated by reference herein.

TECHNICAL FIELD

The subject disclosure relates generally to sensor technology, e.g., techniques for alternate pressure equalization of a sensor.

BACKGROUND

Some sensor devices, such as, for example, a microphone and/or a capacitive sensor device, can comprise a diaphragm and a backplate, which can form a sensor component of the device. The sensor device can include an acoustic port, which can be a hole formed in a portion of a substrate of the device, wherein the diaphragm and backplate can be formed or disposed over the acoustic port. Input signals (e.g., acoustic signals or waves) can be received by the device via the acoustic port and can interact with the diaphragm. In response to the input signals, the diaphragm can move or vibrate in relation to the backplate. The sensor component can generate a sensor signal based at least in part on the movement or vibration of the diaphragm in relation to the backplate. The sensor signal can be processed by the sensor device (e.g., filtered and/or otherwise processed by circuitry or logic of the sensor device) and/or communicated (e.g., via a wireline or wireless connection) to another device, system, or component, associated with the sensor device.

The above-described description is merely intended to provide a contextual overview relating to sensor technology, and is not intended to be exhaustive.

SUMMARY

The following presents a simplified summary of various aspects of the disclosed subject matter in order to provide a basic understanding of some aspects described herein. This summary is not an extensive overview of the disclosed subject matter. It is intended to neither identify key or critical elements of the disclosed subject matter nor delineate the scope of such aspects. Its sole purpose is to present some concepts of the disclosed subject matter in a simplified form as a prelude to the more detailed description that is presented later.

One or more embodiments, such as one or more devices, systems, methods, integrated circuits, and techniques disclosed herein, relate to employing an alternate (e.g., secondary) vent path in a sensor to facilitate providing desirable pressure equalization for the sensor while preventing or at least desirably inhibiting liquids or particles from entering a back cavity of the sensor and providing desirable performance of the sensor. Disclosed herein is a system comprising a sensor assembly component comprising a substrate component, wherein an acoustic port is formed in a first portion of the substrate component. The system also comprises a sensor component comprising a diaphragm component disposed over the acoustic port. The system further comprises a vent component that is associated with a vent port formed in a second portion of the sensor assembly component other than the diaphragm component, wherein the sensor assembly component comprises a back cavity that is partially formed and defined by the substrate component, the sensor component, and the vent component, and wherein the vent port provides a vent path.

Further disclosed herein is a device comprising a substrate component, wherein an acoustic port is formed in a first portion of the substrate component. The device also comprises a sensor component comprising a diaphragm component disposed over the acoustic port, and one or more backplate components disposed over the acoustic port. The device further comprises a vent component that is associated with a vent port formed in a second portion of the device other than the diaphragm component and the backplate component, wherein the device comprises a back cavity that is partially formed and defined by the substrate component, the sensor component, and the vent component, and wherein the vent port provides a venting path that facilitates an equalization of pressure associated with the diaphragm component.

The following description and the annexed drawings set forth in detail certain illustrative aspects of the disclosed subject matter. These aspects are indicative, however, of but a few of the various ways in which the principles of the disclosed subject matter may be employed, and the disclosed subject matter is intended to include all such aspects and their equivalents. Other advantages and distinctive features of the disclosed subject matter will become apparent from the following detailed description of the disclosed subject matter when considered in conjunction with the drawings.

DETAILED DESCRIPTION

Figure 1:
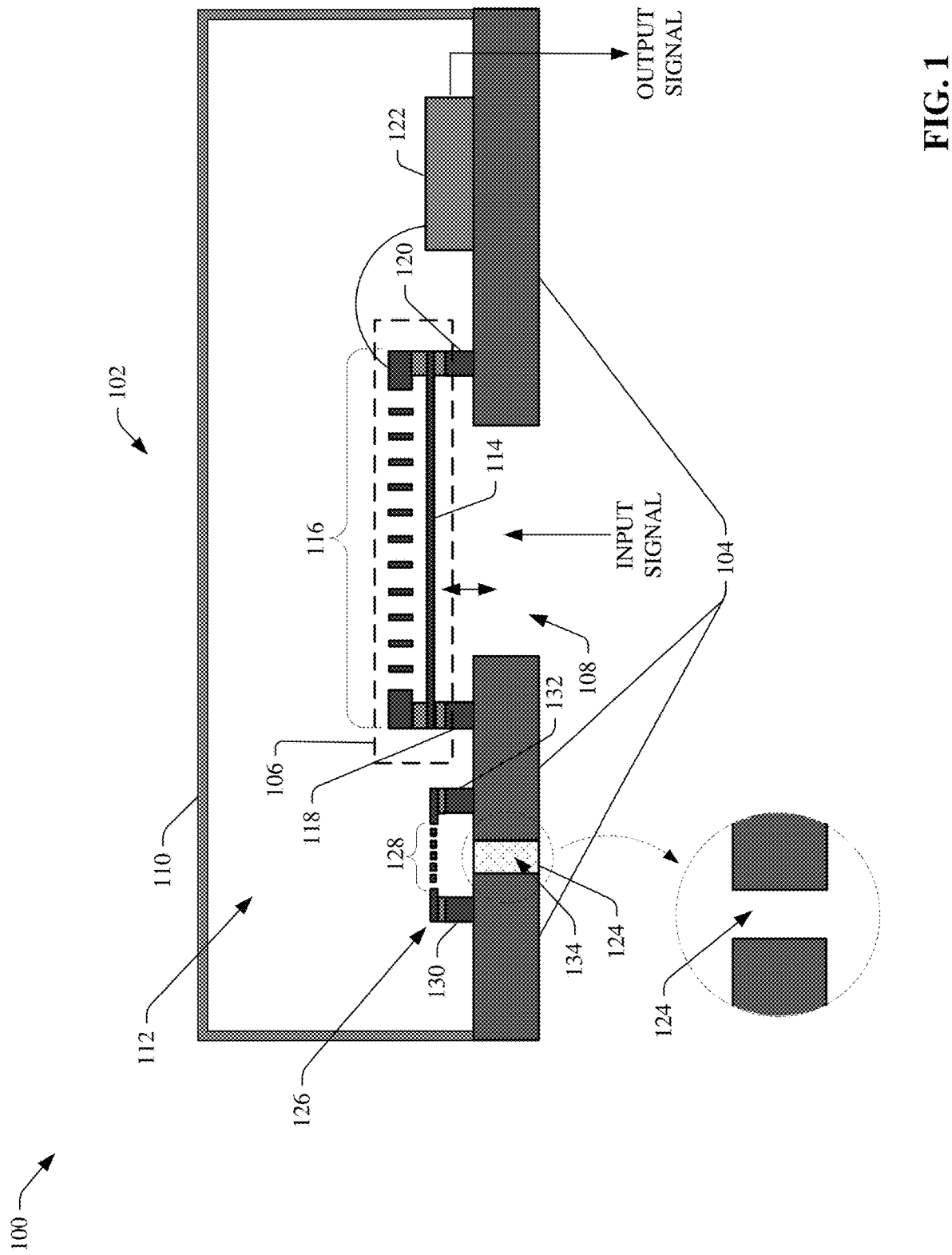
FIG. 1 illustrates a cross-sectional diagram of an example system that can employ an alternate (e.g., secondary) venting path in a sensor device to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter.

The disclosed subject matter is described with reference to the drawings, wherein like reference numerals are used to refer to like elements throughout. In the following description, for purposes of explanation, numerous specific details are set forth in order to provide a thorough understanding of the various embodiments of the subject disclosure. It may be evident, however, that the disclosed subject matter may be practiced without these specific details. In other instances, well-known structures and devices are shown in block diagram form in order to facilitate describing the various embodiments herein.

Some types of sensors, such as microphones (e.g., a MicroElectroMechanical Systems (MEMS) microphone, electret microphone, condenser microphone, or piezo microphone) or other audio or acoustic sensors, can comprise a diaphragm that can vibrate, and facilitate generating a signal (e.g., sensor signal) in response to input signals (e.g., acoustic sounds or signals) received by the sensor via an acoustic port (e.g., acoustic opening or hole) of the sensor device. For example, some sensors can comprise sensor component that can include a backplate in proximity to the diaphragm, wherein the sensor component can generate a signal based at least in part on the movement of the diaphragm in relation to the backplate in response to an input signal received by the sensor via the acoustic port. Traditionally, a diaphragm can comprise holes or other small air pathways in the diaphragm structure to provide suitable pressure equalization that can be desired by sensors, such as microphones, in order for such sensors to function properly.

Liquids and/or particles can enter such traditional sensor device through the acoustic port and into the sensor package via these small holes or pathways in the diaphragm. Traditionally, to try to prevent liquids and/or particles from entering the sensor package, a filter, such as a particle ingress filter (PIF), of some type can be placed over the acoustic port of the sensor device. The filter may inhibit liquid and relatively large particles (e.g., dust) from entering the sensor package via the acoustic port and diaphragm holes or pathways. However, the filter may not prevent liquid and/or relatively fine particles from entering the sensor package, it can degrade the performance of the sensor device, and it can still be desirable to have a pressure equalization path.

To overcome issues of other systems, methods, and techniques are presented that can employ an alternate (e.g., secondary) venting path in a sensor device to facilitate providing desirable pressure equalization for the sensor device while preventing or at least desirably inhibiting liquids or particles from entering the back cavity of the sensor device and providing desirable performance, including desirable frequency response, signal-to-noise ratio (SNR) (e.g., a desirably high SNR), and total harmonic distortion (THD) (e.g., a desirably low THD), of the sensor device. The sensor device can comprise a sensor component that can include a diaphragm component and/or a backplate component that can be disposed over an acoustic port of the sensor device.

In some embodiments, the diaphragm component can be formed with no holes to prevent liquid or particles from entering a back cavity of the sensor device. One or more venting ports can be formed in the sensor package to create an alternate (e.g., secondary) venting path(s) to the back cavity to facilitate equalize pressure, or at least substantially equalize pressure, on either side of the diaphragm component. In accordance with various embodiments, the one or more venting ports can be formed in at least one of a substrate component, a lid component, a circuit component (e.g., an application-specific integrated circuit (ASIC)), or a handle component of the sensor device.

The disclosed subject matter also can include a venting component that can comprise a filter, membrane, and/or hydrophobic coating that can be associated with (e.g., disposed over or integrated with) the one or more venting ports to inhibit liquid and particles from entering the back cavity via the one or more venting ports, without degrading performance of the sensor device. In certain embodiments, the venting component can be designed to achieve a desired low frequency corner of the frequency response of the sensor device and/or, as desired, in conjunction with the known acoustic resistance of the water/particle proofing treatment of the one or more vent ports (e.g., one or more alternate vent ports).

These and other aspects of the disclosed subject matter are described with regard to the figures.

Turning to FIG. 1, illustrated is a cross-sectional diagram of an example system 100 that can employ an alternate (e.g., secondary) venting path in a sensor device to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter. The system 100 can be, can comprise, or can be used in connection with an acoustic sensor (e.g., a microphone), a condenser sensor (e.g., a condenser microphone), an electret sensor (e.g., an electret condenser microphone (ECM)), a capacitive sensor, a capacitive antenna, a piezo sensor, and/or other types of sensors, components, or devices. In some implementations, the system 100 can be, can comprise, or can be used in connection with a MEMS or semiconductor microphone or other sensor.

The system 100 can be or can comprise a sensor device 102 that can sense signals or waves (e.g., input signals, such as acoustic waves). The sensor device 102 can be or can comprise a sensor assembly or sensor package that can comprise various components of the sensor device 102, such as described herein. The sensor device 102 can include a substrate component 104 (e.g., substrate) that can be formed using one or more desired materials, such as, for example, a laminate, copper, fiberglass, ceramics (e.g., ceramics with embedded conductors), and/or another desired material (e.g., one or more materials that can be suitable for printed circuit board (PCB) construction). For instance, the substrate component 104 (e.g., laminate) can comprise a PCB with desired circuit components, connections (e.g., conductive connections between circuit components), and/or other circuitry, in accordance with the disclosed subject matter. As an example, the substrate component 104 can be or can comprise a structure or stack that can be comprised of the one or more materials (e.g., one or more layers of materials). The substrate component 104 can be formed to be rigid, substantially rigid, or flexible, as desired.

The sensor device 102 also can comprise a sensor component 106 that can sense signals or waves (e.g., input signals, such as acoustic waves) that can impact or interact with the sensor component 106. For example, the sensor component 106 can sense acoustic (e.g., audio) signals or waves that can be received via an acoustic port 108 that can be formed in a portion of the substrate component 104. The acoustic port 108 (e.g., hole or opening) can be formed, for example, by drilling a hole in a desired portion of the substrate component 104 or otherwise removing the desired portion of the substrate component 104 (e.g., using a desired material removal process). The sensor component 106 can be disposed over the acoustic port 108 (e.g., when the sensor device 102 is oriented to have the substrate component 104 be at the bottom of the sensor device 102).

The sensor device 102 also can include a lid component 110 that can be associated with the substrate component 104. For instance, respective ends of the lid component 110 can be connected, bonded, adhered, or attached to respective ends of the substrate component 104. The lid component 110 can have desired dimensions (e.g., length, width, height, depth, and thickness). For example, the lid component 110 can be formed to have a length that corresponds to (e.g., spans or substantially spans) the length of the substrate component 104. Respective sides of the lid component 110 can extend to a desired height from the substrate component 104 to facilitate creating a back cavity 112 (e.g., a backvolume) of the sensor device 102 that can be partially defined by the inner surface of the lid component 110, the substrate component 104 (e.g., a top or inner facing surface of the substrate component), and the sensor component 106 (and can be further defined by other components of the sensor device 102 as more fully described herein), and can have a desired size and/or other desired characteristics. The lid component 110 can be formed of one or more desired materials, such as a conductive material (e.g., conductive metal or other conductive material) and/or another material. As some non-limiting examples, the lid component 110 can be formed of nickel-plated brass, nickel-tin plated stainless steel, a metallized plastic material, and/or another desired material.

With further regard to the sensor component 106, in some embodiments, the sensor component 106 can comprise a diaphragm component 114 and a backplate component 116 that can be formed and/or disposed over the acoustic port 108. In some embodiments, the diaphragm component 114 can be formed and/or disposed over (e.g., directly over) the acoustic port 108 and the backplate component 116 can be formed and/or disposed over, and in proximity to (e.g., within a desired defined distance of), the diaphragm component 114 (and the acoustic port 108) (e.g., as depicted in FIG. 1). In certain embodiments, the diaphragm component 114 can be formed to have no holes to facilitate preventing liquids or particles from entering the back cavity 112 if and when liquids or particles enter the acoustic port 108, as more fully described herein. In accordance with various other embodiments, a backplate component can be formed and/or disposed directly over the acoustic port and a diaphragm component can be formed and/or disposed over that backplate component, and/or another backplate component can be formed and/or disposed over that diaphragm component, as more fully described herein and depicted in certain of the other drawings.

To facilitate disposing or forming the diaphragm component 114 and backplate component 116 over the acoustic port 108, the sensor device can comprise respective stack structures or layers that can be formed on the substrate component 104 in proximity to respective sides or edges of the acoustic port 108. The respective stack structures or layers can comprise a handle component, which, as depicted in the cross-sectional view of the sensor device 102, can comprise a first portion of the handle component 118 and a second portion of the handle component 120. It is to be appreciated and understood that the handle component can be a single component, wherein, in the cross-sectional view of the sensor device 102 in FIG. 1, the single handle component can be depicted as having the first portion of the handle component 118 and the second portion of the handle component 120; and from a different perspective, such as a top view, the handle component can have a circular, rectangular, octagonal, or other desired shape. The handle component (e.g., 118, 120) can be formed from a desired material, such as an insulator material (e.g., a silicon-based insulator material). In some embodiments, the handle component (e.g., 118, 120) can be part of the MEMS (e.g., MEMS device of the sensor device 102). For instance, the handle component (e.g., 118, 120) can be part of the MEMS itself, as opposed to the substrate component 104, wherein the handle component can be formed during fabrication. In accordance with various embodiments, as some non-limiting examples, the handle component (e.g., 118, 120) can comprise a silicon material, a polysilicon material, a silicon on insulator (SOI) material, and/or another desired material(s), such as any material(s) that can be utilized as part of a MEMS process flow.

In certain embodiments, with regard to the sensor device 102, respective ends of the diaphragm component 114 can be associated with (e.g., indirectly or directly placed on, adhered to, bonded to, or otherwise associated with) the handle component (e.g., the first portion of the handle component 118 and the second portion of the handle component 120) to place or suspend the diaphragm component 114 over the acoustic port 108. It is to be appreciated and understood that, in some embodiments, the stack structures or layers can comprise one or more other components (e.g., layers of material) that can be located in between the handle component (e.g., the first portion of the handle component 118 and second portion of the handle component 120) and the diaphragm component 114 and/or between the diaphragm component 114 and the backplate component 116. The disclosed subject matter can form, in part, the stack structures or layers by etching (e.g., using a desired etching process) or otherwise removing material(s) (e.g., using a lithography or drilling process) from an initial stack structure or layers to form the stack structures or layers. That is, for example, with regard to a layer of material of the initial stack structure, the disclosed subject matter can remove a portion of the material from that layer, such as the portion of the material disposed over the acoustic port 108, to form the handle component (e.g., 118, 120) on the stack structures.

The diaphragm component 114 and backplate component 116 can be configured to operate as a variable capacitor. To facilitate forming the variable capacitor of the sensor component 106, the diaphragm component 114 can be configured to have a desirable amount of flexibility to enable the diaphragm component 114 to move or vibrate in response to the input signals or waves received by the system 100 (e.g., received by a microphone via the acoustic port 108). In some embodiments, the backplate component 116 can be configured to be a rigid or substantially rigid structure that can comprise one or more openings, holes, or perforations that can allow air to move through the backplate component 116. As the diaphragm component 114 moves or vibrates in response to the input signal (e.g., one or more acoustic signals or waves), it also can be moving in relation to the backplate component 116, which can vary the capacitance of the variable capacitor, and which can result in sensor component 106 (e.g., the diaphragm component 114 or the backplate component 116) generating a signal (e.g., an electrical signal) that can be based at least in part on (e.g., can correspond to) the input signal. The capacitance level of the variable capacitor can be in the range of, for example, 1 pF to 2 pF, or another desired range of capacitance levels.

In accordance with various embodiments, the signal generated by sensor component 106 can be communicated to a circuit component 122 that can filter and/or otherwise process the signal to generate an output signal that can be output from the sensor device 102 and/or can generate a feedback signal (e.g., the output signal or other signal generated based at least in part on the signal) that can be communicated back to the sensor component 106 for use by the sensor component 106 to facilitate desirably sensing the input signals received by the sensor device 102. The circuit component 122 can comprise desired circuitry (e.g., an integrated circuit), including circuit components (e.g., resistors, capacitors, transistors, diodes, analog-to-digital converters, and/or amplifiers, . . . ) and respective connections (e.g., electrical connections) between respective circuit components, to filter and/or otherwise desirably process the signal to generate the output signal and/or the feedback signal. In some embodiments, the circuit component 122 can be or can comprise an ASIC. The sensor device 102 can provide (e.g., communicate) the output signal (e.g., digital or analog output signal), for example, via a wireline or wireless connection, to another device, system, or component, associated with the sensor device 102.

As disclosed, traditional sensors can have a traditional diaphragm that can have holes (e.g., diaphragm holes) that can provide pressure equalization for a traditional sensor. As a result, if a liquid or particles enter an acoustic port of such traditional sensor, the liquid or particles can enter the back cavity of such traditional sensor via the holes of the traditional diaphragm and the holes or perforations in the backplate, and/or the liquid or particles can become trapped between in the gap between the diaphragm and backplate of such traditional sensor (e.g., the gap between the diaphragm and backplate that can be utilized to facilitate creating the variable capacitance of the sensor). This can damage such traditional sensor and/or can negatively impact the performance of such sensor.

In accordance with various embodiments, the diaphragm component 114 of the sensor device 102 can be formed to have no holes, and, to facilitate controlling (e.g., managing) or equalizing the pressure associated with each side (e.g., back cavity side and acoustic port side) of the diaphragm component 114, the sensor device 102 can comprise one or more venting ports, including, for example, vent port 124, that can be formed in one or more components of the sensor device 102 (e.g., one or more components of the sensor assembly or sensor package of the sensor device 102) other than the diaphragm component 114 (and other than the backplate component 116), wherein the vent port 124 can be formed to have desired dimensions (e.g., length, width). In some embodiments, the vent port 124 can be formed in a portion of the substrate component 104 to create an opening or path (e.g., a secondary or alternate vent path) between the back cavity 112 and the outside of the sensor device 102 to enable desirable pressure equalization on either side of the diaphragm component 114. For example, the disclosed subject matter can utilize an etching process, lithography process, drilling process, or other desired process to etch away or otherwise remove a portion of the material of the substrate component 104 to form the vent port 124. It is to be appreciated and understood that, in accordance with various other embodiments, additionally or alternatively, one or more other vent ports can be formed in another component(s) (e.g., lid component, circuit component, or handle component) of a sensor device (other than the diaphragm component or backplate component), such as more fully described herein with regard to certain of the other drawings.

In some embodiments, a vent component 126, comprising a set of vents 128 (e.g., one or more vents), can be formed and disposed inside the sensor device 102 over the vent port 124. In certain embodiments, the vent component 126 can be or can comprise a MEMS device. The set of vents 128 can allow air to pass through the vent component 126 and vent port 124 to facilitate (e.g., to enable) desirable pressure equalization on either side of the diaphragm component 114. The vent component 126, including the set of vents 128, can be formed of a desired material, such as, for example, an insulator material (e.g., a silicon-based insulator material), having desired dimensions (e.g., diameter, length, or width), which can correspond or substantially correspond to the size (e.g., diameter, length, or width) of the vent port 124. In some embodiments, the vent component 126 can comprise a vent handle component that can comprise a first portion of the vent handle component 130 and a second portion of the vent handle component 132 on which respective ends of the set of vents 128 can be placed (e.g., directly or indirectly placed) to suspend or dispose the set of vents 128 over the vent port 124. The vent handle component (e.g., first portion of the vent handle component 130 and the second portion of the vent handle component 132) can be formed from the same material or a different material (e.g., different insulator material) than the set of vents 128. The disclosed subject matter can form (e.g., create) the set of vents 128, the vent handle component (e.g., 130, 132), and/or any other components of the vent component 126 using a desired etching process, lithography process, drilling process, or other process to etch away or otherwise remove desired material(s) from layers of material of the vent stack structure (e.g., stack of materials or layers that can etched or otherwise processed to form the respective components of the vent component 126).

To facilitate waterproofing or dustproofing the sensor device 102, the disclosed subject matter can employ a particle-and-liquid (PAL) resistance component 134 that can be placed in the vent port 124. It is noted that the exploded view of the vent port 124 is depicted without showing the PAL resistance component 134 to better illustrate the vent port 124 as it can be structured when formed (e.g., by an etching process, lithography process, drilling process, or other desired material removal process of the disclosed subject matter) and prior to implementation of the PAL resistance component 134 with respect to the vent port 124. The PAL resistance component 134 can be or can comprise a filter component and/or a membrane component that can have a desirably high acoustic resistance and/or a desirably small pore size, and/or a desirable liquid-resistant and/or particle resistant coating, such as a hydrophobic coating or superhydrophobic coating, which can be applied to the filter component and/or the membrane component. In some embodiments, additionally or alternatively, the desirable liquid-resistant and/or particle-resistant coating (e.g., hydrophobic or superhydrophobic coating) can be applied to the set of vents 128 of the vent component 126. The PAL resistance component 134, employing the filter component and/or membrane component, and/or the liquid-resistant and/or particle-resistant coating (e.g., hydrophobic or superhydrophobic coating) can inhibit (e.g., inhibit to a desirably high degree or level) or prevent, or at least effectively prevent, liquid and particles from entering the back cavity 112 without degradation to performance of the sensor device 102 (e.g., without reducing SNR or increasing THD of the sensor device 102). In certain embodiments, when a filter component is employed, the filter component can comprise a filter, such as a particle ingress filter (PIF), that can inhibit or prevent, or at least effectively prevent, liquid and particles from entering the back cavity 112 via the vent port 124. The filter, such as the PIF, associated with the vent port 124 can have a desired resistance level. For example, if the filter (e.g., PIF) is providing the desired vent resistance, or at least a desired portion of the vent resistance, for the alternate vent path, the filter can have a relatively high acoustic resistance level. The disclosed subject matter can design and implement the vent port 124, vent component 126, PAL resistance component 134, and/or other components of the sensor device 102 such that the sensor device 102 can be desirably (e.g., suitably, acceptably, sufficiently, or optimally) liquid resistant and/or particle resistant in accordance with (e.g., to satisfy, meet, or exceed) one or more desired defined standards relating to the liquid resistance and/or particle resistance of devices (e.g., the IP code by the International Electrotechnical Commission (IEC), the National Electrical Manufacturers Association (NEMA) rating or standard, and/or another desired standard).

The disclosed subject matter can structure and implement the vent port 124, vent component 126, including the set of vents 128, PAL resistance component 134, and/or the liquid-resistant and/or particle resistant coating (and/or another component(s) of the sensor device 102) to achieve a desired acoustic resistance of the sensor device 102 and/or a desired frequency response, including a desired low frequency corner (or a desired gradient response frequency corner) of the frequency response, by the sensor device 102, in accordance with defined frequency response criteria. It is to be appreciated and understood that, with regard to a non-directional application of a sensor device (e.g., microphone), the frequency response can comprise a low frequency corner, and, with regard to a directionality application (e.g., a microphone having a desired directionality), the frequency response of the sensor device (e.g., microphone) can have what is referred to as a gradient response frequency corner rather than being referred to as a low frequency corner. The acoustic resistance and the frequency response, including the low frequency corner (or gradient response frequency corner) of the frequency response, of the sensor device 102, respectively, can be based at least in part on (e.g., can be affected or influenced by) a variety of factors, including, for example, the size of the vent port, the number of vent ports (e.g., alternate or secondary vent ports) implemented in the sensor device, the location(s) of the vent port(s) on the sensor device (e.g., location of a vent port relative to the location of the diaphragm component and/or acoustic port), the size and/or number of vents of the vent component, the type of membrane component or filter component of the PAL resistance component, the size and/or number of holes in the membrane component (e.g., porous membrane), whether liquid-resistant and/or particle resistant coating (e.g., hydrophobic or superhydrophobic coating) is applied to the vents or the membrane component, whether the vent features of the sensor device 102 (e.g., vent component, vent port, and/or other associated components) are implemented using a MEMS device, and/or other physical, mechanical, and/or electronic features or mechanisms of the sensor device. With further regard to the frequency response, including the low frequency corner of the frequency response, of the sensor device 102, in some embodiments, as desired, the disclosed subject matter can design and implement the alternate vent path, including the vent port 124, vent component 126, and/or PAL resistance component 134, and/or other components of the sensor device 102 to have a same or similar frequency response, including a same or similar low frequency corner of the frequency response, of the sensor device 102 as traditional sensor devices (e.g. traditional microphones) that have diaphragms with holes in them for venting and to achieve pressure equalization, in accordance with applicable frequency response criteria (e.g., when the defined frequency response criteria specifies such a frequency response is desired).

In certain embodiments, if the vent features (e.g., alternate vent path, including the vent component, vent port, PAL resistance component, and/or other vent feature component) of a sensor device are not implemented using MEMS, the disclosed subject matter can achieve a desired resistance (e.g., acoustic or vent resistance) for the sensor device with a hole of a desired size (e.g., 0.11 millimeters (mm) or another desired size) formed in the substrate component (e.g., laminate) or lid component with a desired mesh, such as, for example, a SAATI Acoustex polyester (PES) 7/2 mesh, which can have a specific acoustic resistance of 1800 meter-kilogram-second (MKS) Rayles.

Figure 2:
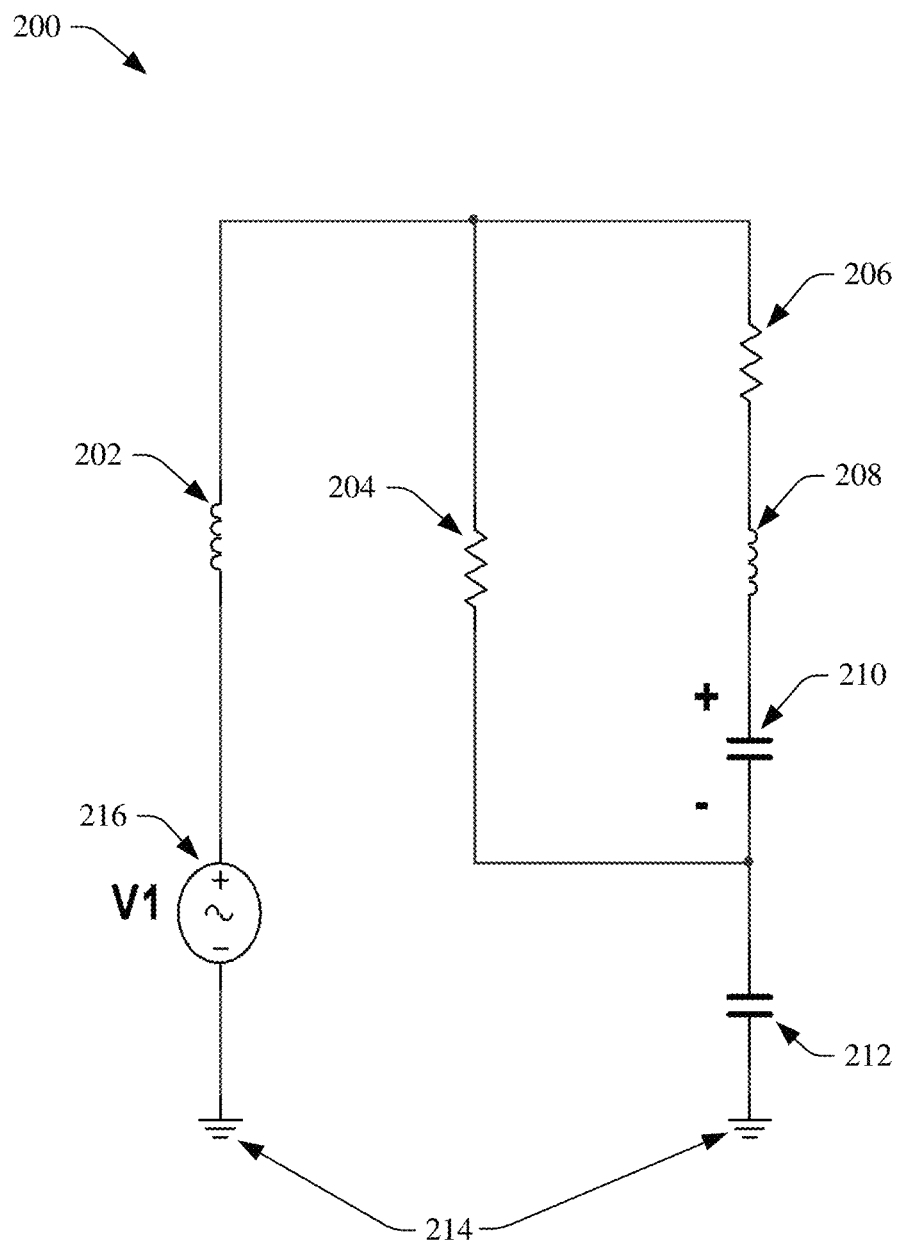
FIG. 2 illustrates a diagram of an example modeling circuit that can model various acoustic impedances relating to a sensor device in the form of a circuit comprising circuit components, in accordance with various aspects and embodiments of the disclosed subject matter.
Figure 3:
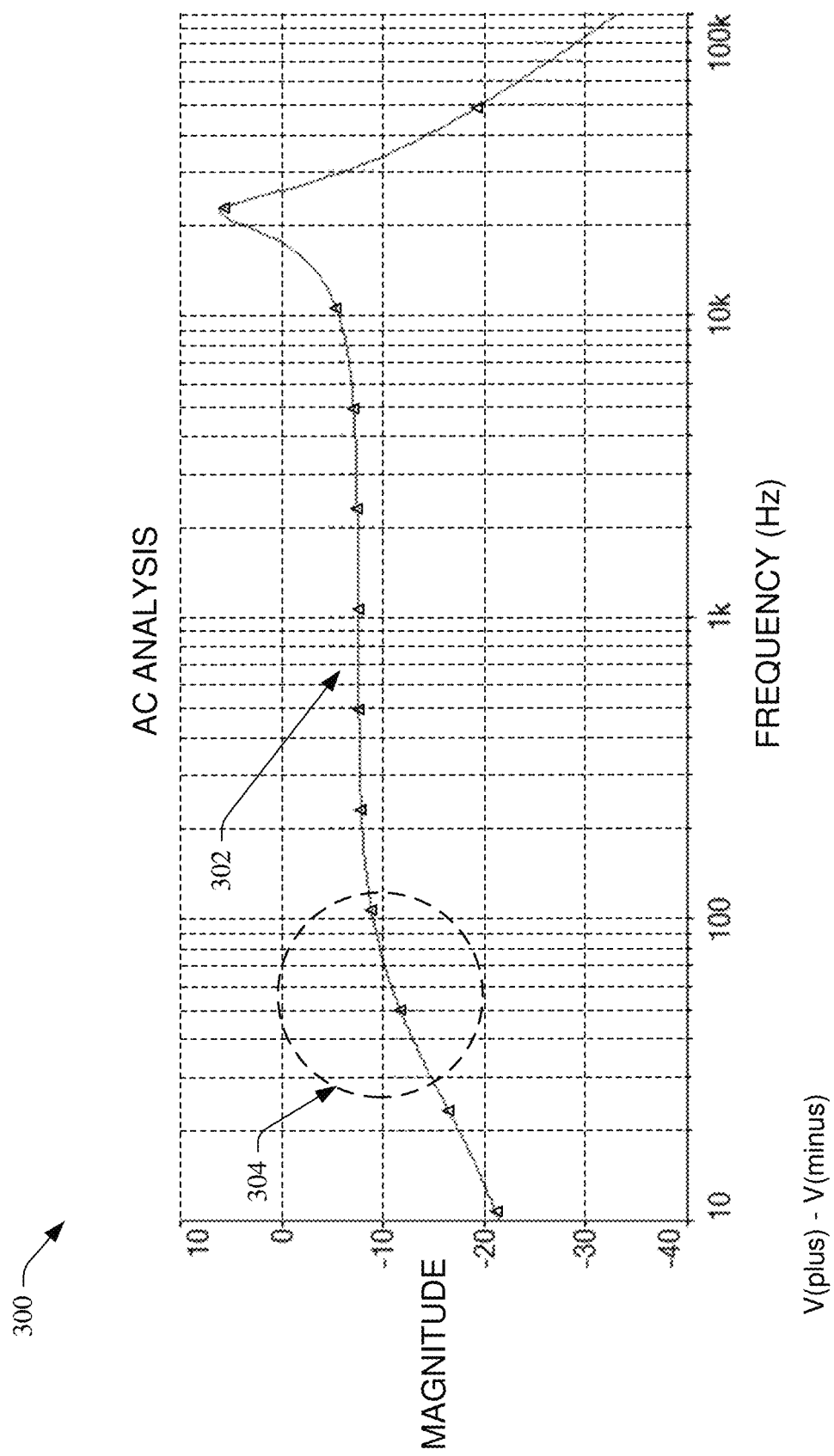
FIG. 3 presents a diagram of an example graph of an alternating current (AC) analysis of a frequency response of the sensor device, in accordance with various aspects and embodiments of the disclosed subject matter.

Referring briefly to FIGS. 2 and 3 (along with FIG. 1), FIG. 2 illustrates a diagram of an example acoustic lumped element modeling circuit 200 comprised of various resistances, compliances, and masses, which can relate to (e.g., can represent) a sensor device, in the form of a circuit comprising circuit components, to illustrate and/or predict sensor (e.g., microphone) performance, in accordance with various aspects and embodiments of the disclosed subject matter. The modeling circuit 200 can be employed to model the frequency response, including the low frequency corner of the frequency response, of a sensor device that includes venting and the associated venting resistance. The low frequency corner of the frequency response of the sensor device can be controlled primarily by vent resistance associated with the vent (e.g., vent port and vent component) and backvolume (e.g., back cavity) of the sensor device. FIG. 3 presents a diagram of an example graph 300 of an alternating current (AC) analysis of a frequency response of the sensor device, in accordance with various aspects and embodiments of the disclosed subject matter.

With further regard to FIG. 2, the modeling circuit 200 can comprise an inductor 202 that can have an inductance level that can correspond to and represent an inductance level associated with an acoustic port (e.g., acoustic port 108) of a sensor device (e.g., sensor device 102). The modeling circuit 200 also can include a resistor 204 that can have a resistance level that can correspond to and represent a resistance level associated with a vent (e.g., vent port 124 and vent component 126) of the sensor device. In parallel with the resistor 204, the modeling circuit 200 further can comprise a resistor 206, an inductor 208, and a capacitor 210, in series with each other, wherein the resistor 206 can correspond to and represent a resistance level associated with a backplate (e.g., backplate component 116) of the sensor device, the inductor 208 can have an inductance level that can correspond to and represent an acoustic mass level associated with a diaphragm (e.g., diaphragm component 114) of the sensor device, and the capacitor 210 can have a capacitance level that can correspond to and represent a compliance level associated with the diaphragm. The resistor 204 and the resistor 206 can be associated with (e.g., connected to) the inductor 202 at a node of the modeling circuit 200. The resistor 204 and the capacitor 210 can be associated with (e.g., connected to) capacitor 212 that can have a capacitance level that can correspond to and represent a compliance level associated with a back cavity (e.g., back cavity 112) of the sensor device, wherein the capacitor 212 can be associated with a ground 214 that can be at ground level. The inductor 202 can have an inductance level that can correspond to and represent the acoustic mass associated with the acoustic port (e.g. acoustic port 108). The inductor 202 can be associated with (e.g., connected to) and driven by a voltage source 216, wherein the source 216 can represent the input sound pressure to the acoustic port (e.g., sound port) and reference voltage for the associated circuit analysis and simulation of the acoustic lumped element model represented by the acoustic lumped element modeling circuit 200.

In some embodiments, the disclosed subject matter can determine the low frequency corner (or gradient response frequency corner) of the frequency response of the sensor device (e.g., sensor device 102) based at least in part on (e.g., as a function of) the equation $1/2\pi RC$, wherein R can be the resistance (e.g., acoustic resistance) of the vent features of the sensor device (e.g., vent port, vent component, including the set of vents, the PAL resistance component, and/or other features associated with the vent port or vent component) and C can be the compliance level of or associated with the back cavity (e.g., backvolume) of the sensor device.

With further regard to FIG. 3, the example graph 300 illustrates an AC analysis of the frequency response 302 of the sensor device, including respective magnitudes of the response at respective frequencies, in Hertz (Hz). As disclosed, the low frequency corner 304 of the frequency response 302 can be controlled primarily by a vent resistance that can be associated with the vent (e.g., vent port 124 and vent component 126, including the filter component, membrane component, and/or hydrophobic coating associated with the vent port 124 or vent component 126) and the backvolume (e.g., back cavity 112) of the sensor device (e.g., sensor device 102).

With further regard to the system 100 of FIG. 1, as desired, in some embodiments, the disclosed subject matter can purposely arrange or structure the components of the sensor device 102, including, for example, the diaphragm component 114 and the vent port 124, to achieve desired directionality of the sensor device 102 (e.g., directionality of the microphone). For instance, the vent port 124 can be placed a desired distance away (e.g., a further distance away) from the diaphragm component 114 in the sensor package of the sensor device 102, and/or can employ other mechanical or electronic features or mechanisms in the sensor device 102, to introduce or create a desired acoustic delay in the sensor device 102 to create a desired directionality in the sensor device 102 (e.g., to create a directional microphone having a desired directionality (e.g., a desired directional sensing or pickup pattern)), in addition to the sensor device 102 providing the desired alternate (e.g., secondary) vent path, via the vent port 124, desired frequency response, including a desired pressure gradient response (as the result of the difference of sound pressure magnitude and phase between the acoustic port 108 and vent port 124), and desired venting and pressure equalization features and the desired particle and liquid resistant features of the sensor device 102. The sensing or pickup pattern of the sensor device 102 (e.g., microphone with desired directionality) can be determined based at least in part on the resistance value (e.g., the value of the acoustic resistance) of the sensor device 102. As one non-limiting example, a vent port can be formed in a location of the lid component of the sensor device that is relatively further away from the diaphragm component than the vent port in the substrate component is from the diaphragm component and/or can employ a housing around the sensor component (e.g., housing located in between the diaphragm component and the vent port in the lid component) to increase the front between the vent port and the diaphragm component to introduce or create a desired acoustic delay in the sensor device and thereby create a desired directional pattern (e.g., directional sensor or pickup pattern) of the sensor device. The value of the acoustic resistance of the alternate vent port 124 can have a desired impact on determining the directional pickup pattern (e.g., cardioid versus figure-eight, etc.).

In accordance with various embodiments, the gradient response frequency corner of the sensor device 102 can be based at least in part on the distance between the alternate vent path (e.g., the vent port 124) and the diaphragm component 114 (as well as other factors). For instance, the further the distance between the alternate vent path and the diaphragm component 114, the lower the gradient response frequency corner of the sensor device 102 can be, and conversely, the shorter the distance between the alternate vent path and the diaphragm component 114, the higher the gradient response frequency corner of the sensor device 102 can be. As a non-limiting example, with regard to the low frequency corner, instead of designing a sensor device (e.g., selecting components of the sensor device, determining and implementing an alternate vent path in a desired location relative to the diaphragm component, determining and implementing a vent component and PAL resistance component, and/or determining and implementing other features of the sensor device) to have a relatively lower low frequency corner, e.g., as depicted by the example low frequency corner 304 in the example frequency response 302 of the example graph 300 of FIG. 3, as desired, to create a desired directional sensor device (e.g., directional microphone), the disclosed subject matter can be employed to design and implement a desired distance (e.g., relatively longer distance) between the alternate vent path (e.g., vent port) and the diaphragm component, design and implement a desired amount of resistance (e.g., acoustic resistance) for the sensor device, and/or design and implement an obstruction (e.g., physical, mechanical, or electronic feature or mechanism) between the alternate vent path and the diaphragm component or acoustic port of the sensor device, to thereby correspondingly introduce, create, produce, or achieve a pressure gradient response in the range of, for example, one, two, or several kilohertz (kHz), or another desired frequency or frequency range, because a directional sensor (e.g., directional microphone) can have a falling response (e.g., a gradient response), which can decrease a certain number of decibels (dBs) per octave (e.g., 5, 5.5, 6, or other number of dBs per octave).

Figure 4:
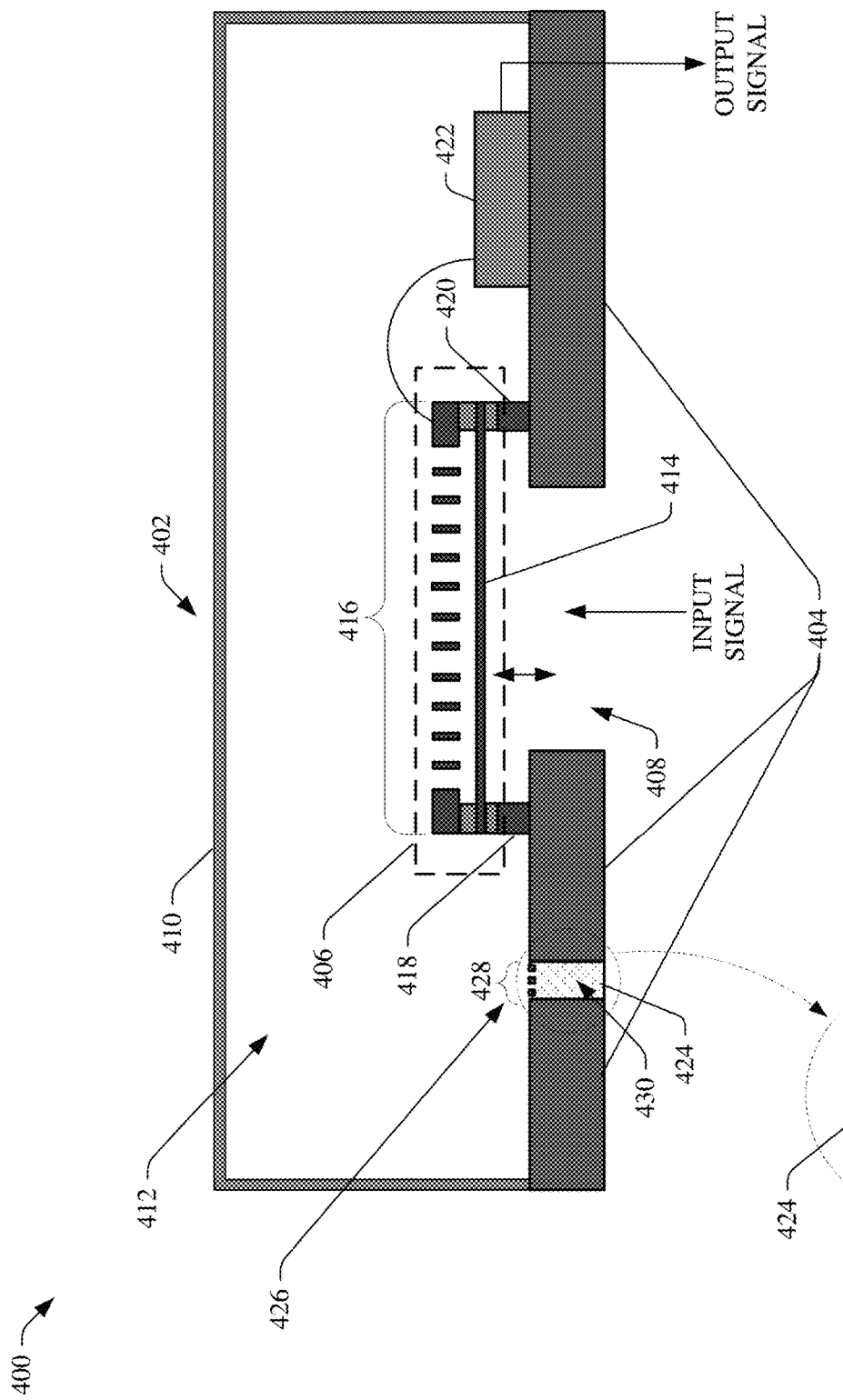
FIG. 4 depicts a cross-sectional diagram of an example system that can employ an alternate venting path, formed via a vent port with an integrated vent component, in a sensor device to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter.

FIG. 4 depicts a cross-sectional diagram of an example system 400 that can employ an alternate (e.g., secondary) venting path, formed via a vent port with an integrated vent component, in a sensor device to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter. The system 400 can be substantially the same as the system 100 of FIG. 1, except that the system 400 can have a vent component, comprising a set of vents, that can be integrated with a vent port formed in the substrate component of the sensor device.

The system 400 can comprise a sensor device 402 that can be or can comprise a sensor assembly or sensor package that can comprise various components of the sensor device 402, such as described herein. The sensor device 402 can comprise a substrate component 404 (e.g., substrate), a sensor component 406, an acoustic port 408, a lid component 410, and a back cavity 412, wherein the sensor component 406 can comprise a diaphragm component 414 and a backplate component 416. The sensor device 402 also can include a handle component, comprising a first portion of the handle component 418 and a second portion of the handle component 420 (e.g., a single handle component with first and second portions of the handle component being depicted in the cross-sectional view of the sensor device 402 in FIG. 4). The sensor device 402 further can include a circuit component 422 and a vent port 424. These respective components of the system 400 can be the same as or similar to, and/or can comprise the same or similar features or functionalities as, respective components (e.g., respectively named components), such as more fully disclosed herein. These respective components of the system 400 can be arranged in relation to each other as depicted in FIG. 4 and as more fully described herein (e.g., with regard to system 100 of FIG. 1).

In some embodiments, the sensor device 402 can comprise a vent component 426, comprising a set of vents 428, that can be integrated with the vent port 424 formed in the substrate component 404, rather than disposed over the vent port, as depicted in the sensor device 102 of FIG. 1, although the vent port 424, vent component 426, and the set of vents 428 can function the same or essentially the same as the vent port 124, vent component 126, and set of vents 128, respectively, of the sensor device 102 of FIG. 1. For example, the vent component 426 can be formed in the substrate component 404 using a desired etching, drilling, or material (e.g., substrate material) removal process to create one or more holes or vents having desired dimensions.

The sensor device 402 also can comprise a PAL resistance component 430 that can be placed in or integrated with the vent port 424. It is noted that the exploded view of the vent port 424 is depicted without showing the PAL resistance component 430 to better illustrate the vent port 424 as it can be structured when formed (e.g., by an etching process or other desired material removal process of the disclosed subject matter) and prior to implementation of the PAL resistance component 430 with respect to the vent port 424. The PAL resistance component 430 can be or can comprise a filter component and/or a membrane component that can have a desirably high acoustic resistance and/or a desirably small pore size, and/or a desirable liquid-resistant and/or particle resistant coating, such as a hydrophobic coating or superhydrophobic coating, which can be applied to the filter component and/or the membrane component. In some embodiments, additionally or alternatively, the desirable liquid-resistant and/or particle resistant coating (e.g., hydrophobic or superhydrophobic coating) can be applied to the set of vents 428 of the vent component 426. The PAL resistance component 430 can be the same as or substantially the same as the PAL resistance component 134 of sensor device 102 of FIG. 1. The PAL resistance component 430, utilizing the filter component and/or membrane component, and/or the liquid-resistant and/or particle resistant coating (e.g., hydrophobic or superhydrophobic coating) can inhibit or prevent, or at least effectively prevent, liquid and particles from entering the back cavity 412 without degradation to performance of the sensor device 402 (e.g., without reducing SNR or increasing THD of the sensor device 402).

The sensor device 402, employing the vent port 424, which can provide alternate or secondary vent path, the vent component 426, and PAL resistance component 430, can be configured or designed to achieve a desired frequency response, including a desired low frequency corner of the frequency response, of the sensor device 402. In some embodiments, the sensor device 402, employing the vent port 424, the vent component 426, and PAL resistance component 430, can be configured or designed to achieve the desired frequency response, including the desired low frequency corner of the frequency response, in conjunction with the known acoustic resistance of the PAL resistance component 430 (e.g., the acoustic resistance of the filter component, membrane component, and/or hydrophobic coating).

Figure 5:
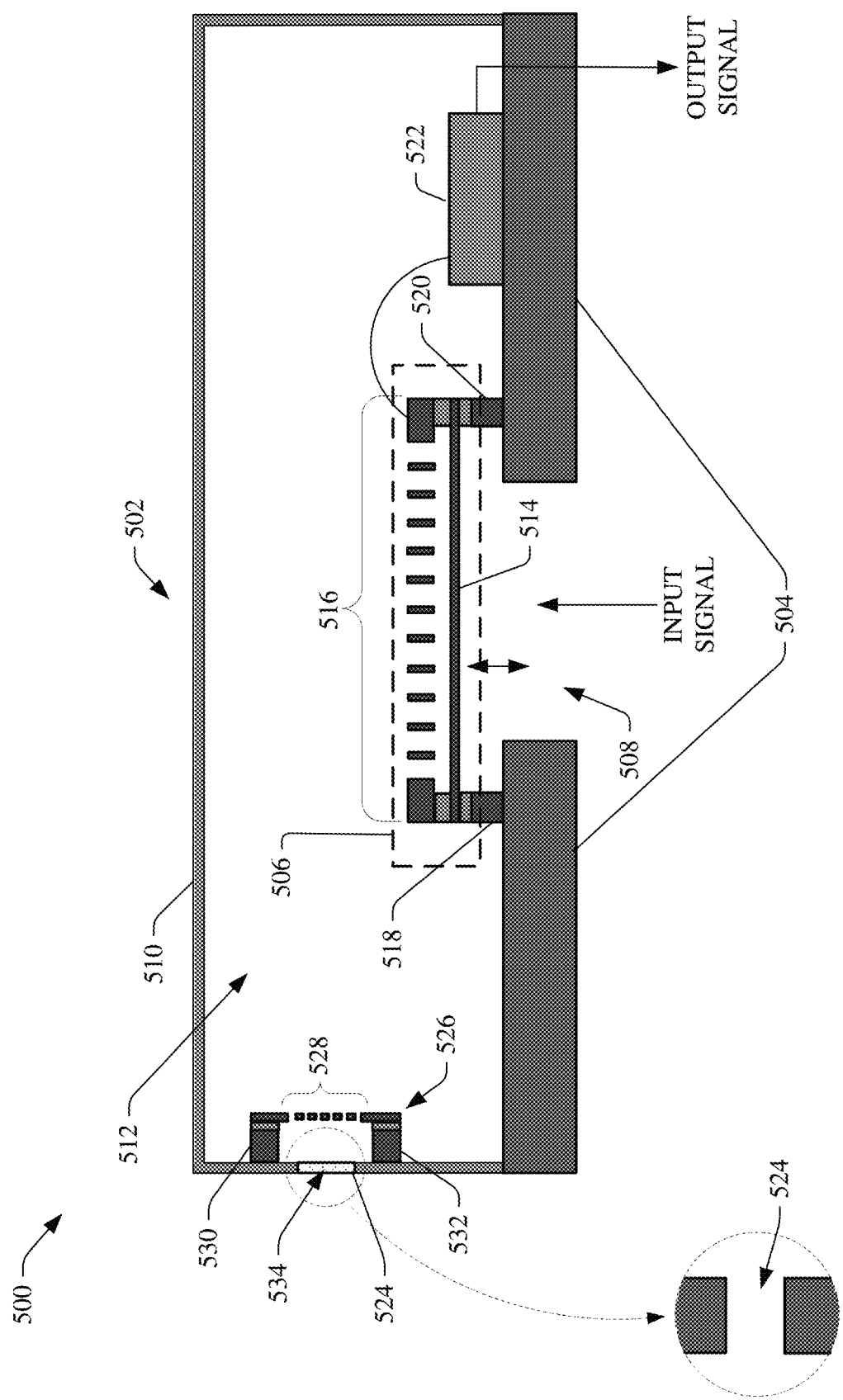
FIG. 5 illustrates a cross-sectional diagram of an example system that can employ an alternate venting path, which can be formed in a lid component, in a sensor device, in accordance with various aspects and embodiments of the disclosed subject matter.

FIG. 5 illustrates a cross-sectional diagram of an example system 500 that can employ an alternate (e.g., secondary) venting path, which can be formed in a lid component, in a sensor device, in accordance with various aspects and embodiments of the disclosed subject matter. The system 500, by employing the alternate venting path formed in the lid component, can facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter. The system 500 can be substantially the same as the system 100 of FIG. 1, except that the system 500 can have a vent port formed in a lid component of the sensor device to form an alternate venting path in the sensor device.

The system 500 can comprise a sensor device 502 that can be or can comprise a sensor assembly or sensor package that can comprise various components of the sensor device 502, such as described herein. The sensor device 502 can comprise a substrate component 504, a sensor component 506, an acoustic port 508, a lid component 510, and a back cavity 512, wherein the sensor component 506 can comprise a diaphragm component 514 and a backplate component 516. The sensor device 502 also can comprise a handle component, including a first portion of the handle component 518 and a second portion of the handle component 520. The sensor device 502 further can include a circuit component 522. These respective components of the system 500 can be the same as or similar to, and/or can comprise the same or similar features or functionalities as, respective components (e.g., respectively named components), such as more fully disclosed herein. These respective components of the system 500 can be arranged in relation to each other as depicted in FIG. 5 and as more fully described herein (e.g., with regard to system 100 of FIG. 1).

In some embodiments, the sensor device 502 can include a vent port 524 that can be formed in a desired portion of the lid component 510. For example, the disclosed subject matter can utilize an etching process, lithography process, drilling process, or other desired process to etch away or otherwise remove a portion of the material of the lid component 510 to form the vent port 524. In FIG. 5, the vent port 524 is depicted as being located in a portion of a side (e.g., left side) of the lid component 510. It is to be appreciated and understood though that, in accordance with various embodiments of the disclosed subject matter, alternatively or additionally, a vent port (e.g., vent port 524) can be formed in a portion of the top side of the lid component 510 or a portion of another side (e.g., right side) of the lid component 510. The disclosed subject matter can form the vent port 524 to have desired dimensions (e.g., length, width). The vent port 524 can be formed in the portion of the lid component 510 to create an opening or path (e.g., a secondary or alternate vent path) between the back cavity 512 and the outside of the sensor device 502 to enable desirable equalization or control of pressure (e.g., pressure equalization) on either side of the diaphragm component 514.

The sensor device 502 also can comprise a vent component 526, which can include a set of vents 528. The vent component 526 can be associated with the vent port 524. For instance, the set of vents 528 can be disposed over the vent port 524. In some embodiments, the vent component 526 can comprise a vent handle component that can include a first portion of the vent handle component 530 and a second portion of the vent handle component 532 on which respective ends of the set of vents 528 can be placed (e.g., directly or indirectly placed) to suspend or dispose the set of vents 528 over the vent port 524, wherein the vent handle component (e.g., 530, 532) can be formed (e.g., directly or indirectly formed) on an inner surface of the lid component 510 in proximity to the vent port 524. The vent handle component (e.g., 530, 532) can be formed from the same material or a different material (e.g., different insulator material) than the set of vents 528. The disclosed subject matter can form (e.g., create) the set of vents 528, the vent handle component (e.g., 530, 532), and/or any other components of the vent component 526 using a desired etching process, lithography process, drilling process, or other process to etch away or otherwise remove desired material(s) from layers of material of the vent stack structure (e.g., stack of materials or layers that can etched or otherwise processed to form the respective components of the vent component 526). The vent port 524, vent component 526, and the set of vents 528 can function the same or essentially the same as the vent port 124, vent component 126, and set of vents 128, respectively, of the sensor device 102 of FIG. 1.

In certain embodiments, the vent component 526 can be integrated with the vent port 524, wherein, for example, the disclosed subject matter can form the vent component 526 (e.g., the set of vents 528 of the vent component 526) in the lid component 510 using a desired etching, lithography, drilling, or material removal process to create one or more holes or vents (e.g., having desired dimensions) in the lid component 510 or by employing a lid component 510 comprising a desired porous material (e.g., porous metal and/or conductive material) that can have pores of a desirable size that can be implemented as vents (wherein, in such embodiments, the vent component 526 would not have to have the vent handle components (e.g., 530, 532)).

The sensor device 502 also can comprise a PAL resistance component 534 that can be placed in or integrated with the vent port 524. It is noted that the exploded view of the vent port 524 is depicted without showing the PAL resistance component 534 to better illustrate the vent port 524 as it can be structured when formed (e.g., by an etching process, lithography process, or other desired material removal process of the disclosed subject matter) and prior to implementation of the PAL resistance component 534 with respect to the vent port 524. The PAL resistance component 534 can be or can comprise a filter component and/or a membrane component that can have a desirably high acoustic resistance and/or a desirably small pore size, and/or a desirable liquid-resistant and/or particle resistant coating (e.g., hydrophobic coating or superhydrophobic coating), which can be applied to the filter component and/or the membrane component. In some embodiments, additionally or alternatively, the desirable liquid-resistant and/or particle resistant coating can be applied to the set of vents 528 of the vent component 526. The PAL resistance component 534 can be the same as or substantially the same as the PAL resistance component 134 of sensor device 102 of FIG. 1. The PAL resistance component 534, utilizing the filter component and/or membrane component, and/or the liquid-resistant and/or particle resistant coating can inhibit or prevent, or at least effectively prevent, liquid and particles from entering the back cavity 512 without degradation to performance of the sensor device 502 (e.g., without reducing SNR or increasing THD of the sensor device 502).

The sensor device 502, employing the vent port 524, the vent component 526, and the PAL resistance component 534, can be configured or designed to achieve a desired frequency response, including a desired low frequency corner of the frequency response, of the sensor device 502. In some embodiments, the sensor device 502, employing the vent port 524, the vent component 526, and the PAL resistance component 534, can be configured or designed to achieve the desired frequency response, including the desired low frequency corner of the frequency response, in conjunction with the known acoustic resistance of the PAL resistance component 534 (e.g., the acoustic resistance of the filter component, membrane component, and/or hydrophobic coating).

Figure 6:
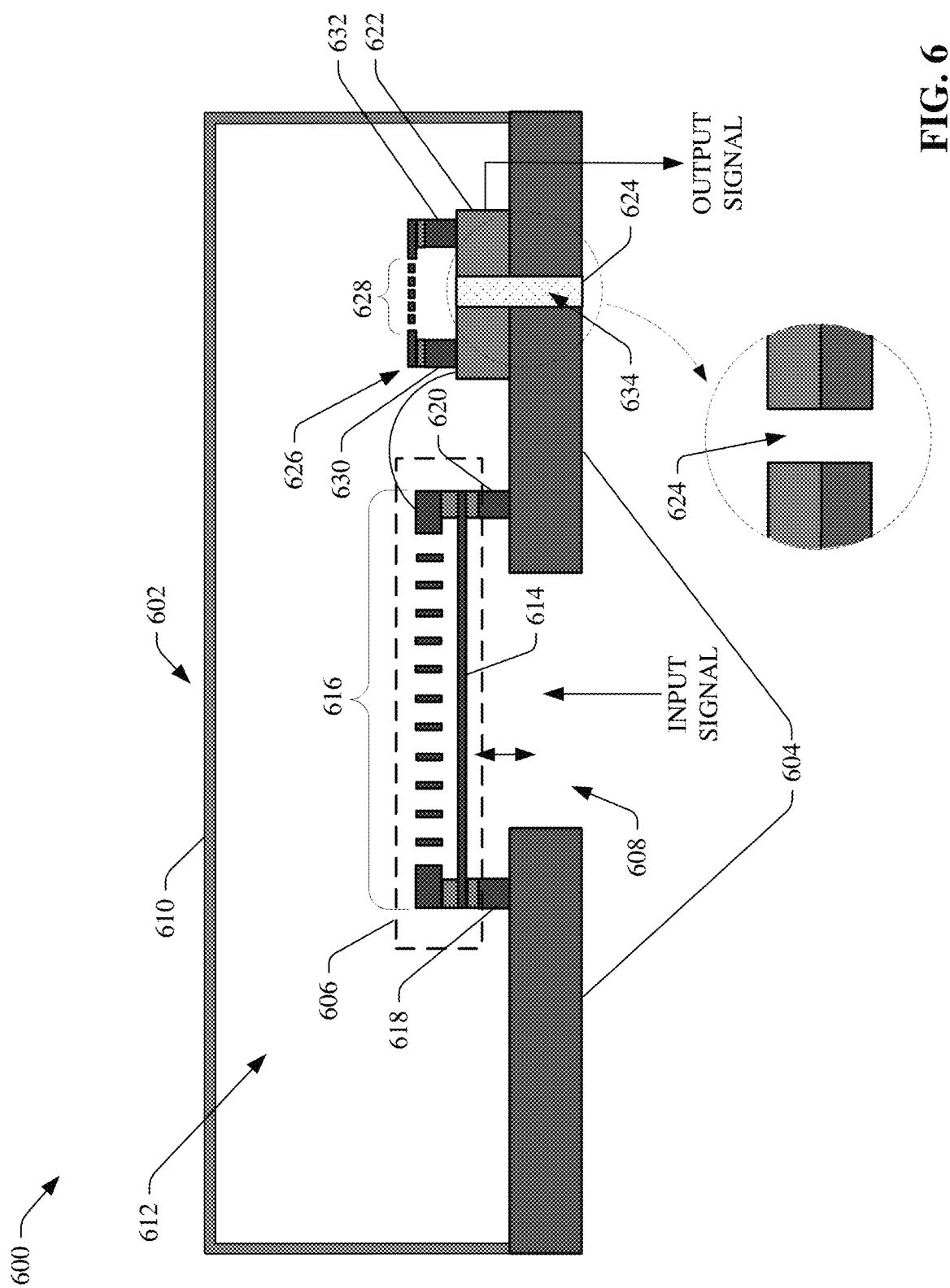
FIG. 6 depicts a cross-sectional diagram of an example system that can employ an alternate venting path, which can be formed in a circuit component, in a sensor device, in accordance with various aspects and embodiments of the disclosed subject matter.

FIG. 6 depicts a cross-sectional diagram of an example system 600 that can employ an alternate (e.g., secondary) venting path, which can be formed in a circuit component, in a sensor device, in accordance with various aspects and embodiments of the disclosed subject matter. The system 600, by employing the alternate venting path formed in the circuit component (e.g., ASIC), can facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter. The system 600 can be substantially the same as the system 100 of FIG. 1, except that the system 600 can have a vent port formed in a circuit component (e.g., ASIC) and substrate component of the sensor device to form an alternate venting path in the sensor device.

The system 600 can comprise a sensor device 602 that can be or can comprise a sensor assembly or sensor package that can comprise various components of the sensor device 602, such as more fully described herein. The sensor device 602 can comprise a substrate component 604, a sensor component 606, an acoustic port 608, a lid component 610, and a back cavity 612, wherein the sensor component 606 can comprise a diaphragm component 614 and a backplate component 616. The sensor device 602 also can comprise a handle component, which can include a first portion of the handle component 618 and a second portion of the handle component 620. The sensor device 602 further can comprise a circuit component 622. These respective components of the system 600 can be the same as or similar to, and/or can comprise the same or similar features or functionalities as, respective components (e.g., respectively named components), such as more fully disclosed herein. These respective components of the system 600 can be arranged in relation to each other as illustrated in FIG. 6 and as more fully described herein (e.g., with regard to system 100 of FIG. 1).

In some embodiments, the sensor device 602 can include a vent port 624 that can be formed in a desired portion of the circuit component 622 and substrate component 604. For example, the disclosed subject matter can utilize an etching process, lithography process, drilling process, or other desired process to etch away or otherwise remove a portion of the material of the circuit component 622 and a portion of the material of the substrate component 604 to form the vent port 624. The disclosed subject matter can form the vent port 624 to have desired dimensions (e.g., length, width). The vent port 624 can be formed in the respective portions of the circuit component 622 and the material of the substrate component 604 to create an opening or path (e.g., a secondary or alternate vent path) between the back cavity 612 and the outside of the sensor device 602 to enable desirable equalization or control of pressure (e.g., pressure equalization) on either side of the diaphragm component 614.

The sensor device 602 also can comprise a vent component 626, which can include a set of vents 628. The vent component 626 can be associated with the vent port 624. For example, the set of vents 628 can be disposed over the vent port 624. In some embodiments, the vent component 626 can comprise a vent handle component that can include a first portion of the vent handle component 630 and a second portion of the vent handle component 632 on which respective ends of the set of vents 628 can be placed (e.g., directly or indirectly placed) to suspend or dispose the set of vents 628 over the vent port 624, wherein the vent handle component (e.g., 630, 632) can be formed (e.g., directly or indirectly formed) on a top surface of the circuit component 622 in proximity to the vent port 624. The vent handle component (e.g., 630, 632) can be formed from the same material or a different material (e.g., different insulator material) than the set of vents 628. The disclosed subject matter can form (e.g., create) the set of vents 628, the vent handle component (e.g., 630, 632), and/or any other components of the vent component 626 using a desired etching process, lithography process, drilling process, or other process to etch away or otherwise remove desired material(s) from layers of material of the vent stack structure (e.g., stack of materials or layers that can etched or otherwise processed to form the respective components of the vent component 626). The vent port 624, vent component 626, and the set of vents 628 of the sensor device 602 of FIG. 6 can function the same or essentially the same as the vent port 124, vent component 126, and set of vents 128, respectively, of the sensor device 102 of FIG. 1.

The sensor device 602 further can include a PAL resistance component 634 that can be placed in or integrated with the vent port 624. It is noted that the exploded view of the vent port 624 is depicted without showing the PAL resistance component 634 to better illustrate the vent port 624 as it can be structured when formed (e.g., by an etching process, lithography process, drilling process, or other desired material removal process of the disclosed subject matter) and prior to implementation of the PAL resistance component 634 with respect to the vent port 624. The PAL resistance component 634 can be or can comprise a filter component and/or a membrane component that can have a desirably high acoustic resistance and/or a desirably small pore size, and/or a desirable liquid-resistant and/or particle resistant coating (e.g., hydrophobic coating or superhydrophobic coating), which can be applied to the filter component and/or the membrane component. In some embodiments, additionally or alternatively, the desirable liquid-resistant and/or particle resistant coating can be applied to the set of vents 628 of the vent component 626. The PAL resistance component 634 of the sensor device 602 of FIG. 6 can be the same as or substantially the same as the PAL resistance component 134 of the sensor device 102 of FIG. 1. The PAL resistance component 634, utilizing the filter component and/or membrane component, and/or the liquid-resistant and/or particle resistant coating can inhibit or prevent, or at least effectively prevent, liquid and particles from entering the back cavity 612 without degradation to performance of the sensor device 602 (e.g., without reducing SNR or increasing THD of the sensor device 602).

The sensor device 602, employing the vent port 624, the vent component 626, and the PAL resistance component 634, can be configured or designed to achieve a desired frequency response, including a desired low frequency corner of the frequency response, of the sensor device 602. In some embodiments, the sensor device 602, employing the vent port 624, the vent component 626, and the PAL resistance component 634, can be configured or designed to achieve the desired frequency response, including the desired low frequency corner of the frequency response, in conjunction with the known acoustic resistance of the PAL resistance component 634 (e.g., the acoustic resistance of the filter component, membrane component, and/or hydrophobic coating).

Figure 7:
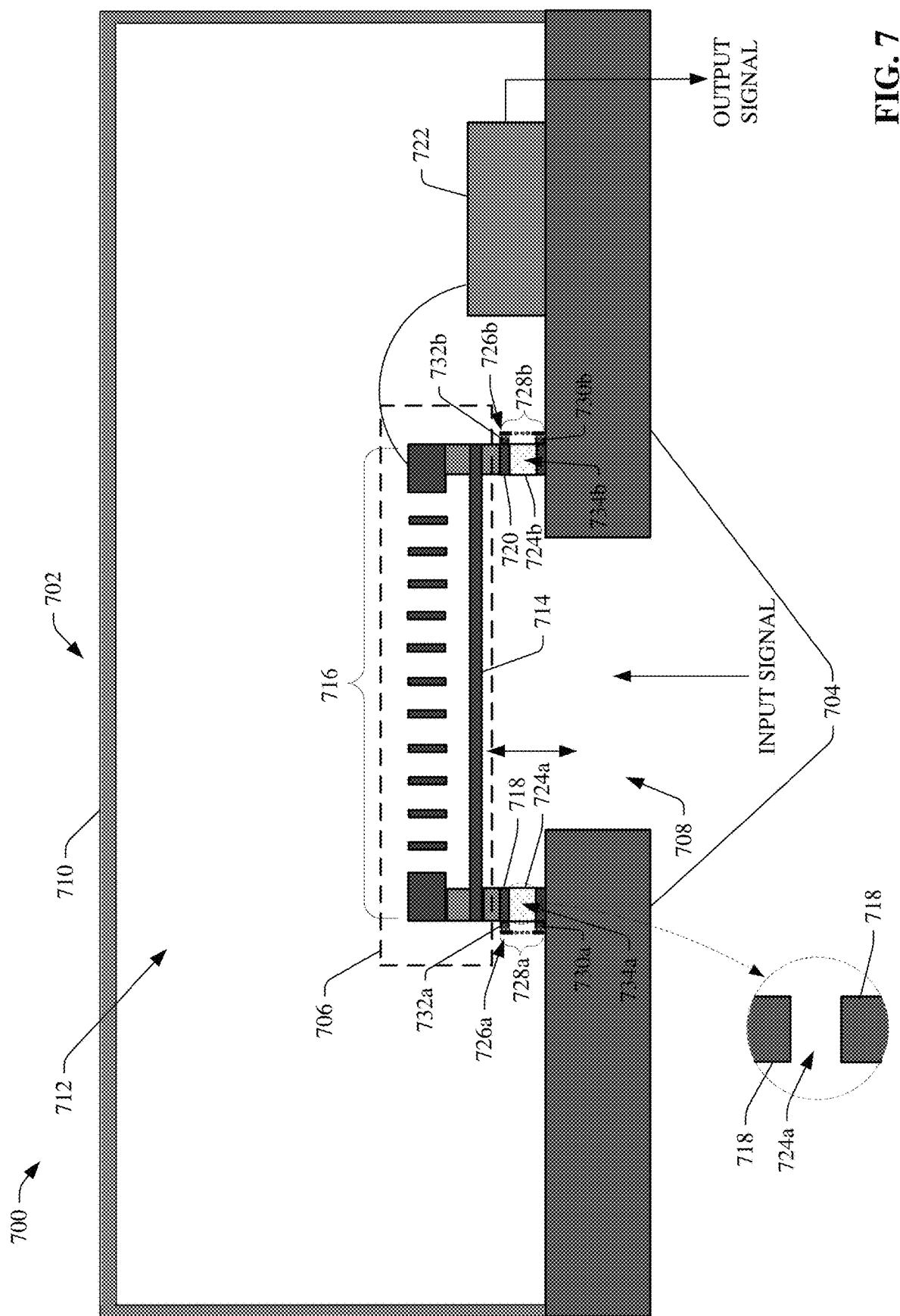
FIG. 7 illustrates a cross-sectional diagram of an example system that can employ an alternate venting path, which can be formed in a handle component, in a sensor device, in accordance with various aspects and embodiments of the disclosed subject matter.

FIG. 7 illustrates a cross-sectional diagram of an example system 700 that can employ an alternate (e.g., secondary) venting path, which can be formed in a handle component, in a sensor device, in accordance with various aspects and embodiments of the disclosed subject matter. The system 700, by employing the alternate venting path formed in the handle component, can facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter. The system 700 can be substantially the same as the system 100 of FIG. 1, except that the system 700 can have a vent port formed in a handle component of the sensor device to form an alternate venting path in the sensor device.

The system 700 can comprise a sensor device 702 that can be or can comprise a sensor assembly or sensor package that can comprise various components of the sensor device 702, such as more fully described herein. The sensor device 702 can comprise a substrate component 704, a sensor component 706, an acoustic port 708, a lid component 710, and a back cavity 712, wherein the sensor component 706 can comprise a diaphragm component 714 and a backplate component 716. The sensor device 702 also can comprise a handle component, which can include a first portion of the handle component 718 and a second portion of the handle component 720. The sensor device 702 further can comprise a circuit component 722. These respective components of the system 700 can be the same as or similar to, and/or can comprise the same or similar features or functionalities as, respective components (e.g., respectively named components), such as more fully disclosed herein. These respective components of the system 700 can be arranged in relation to each other as illustrated in FIG. 7 and as more fully described herein (e.g., with regard to system 100 of FIG. 1).

In some embodiments, the sensor device 702 can include a vent port 724a and/or vent port 724b that can be formed in a desired portion of the first portion of the handle component 718 and/or a desired portion of the second portion of the handle component 720. For example, the disclosed subject matter can utilize an etching process, lithography process, drilling process, or other desired process to etch away or otherwise remove a portion of the material of the first portion of the handle component 718 to form the vent port 724a and/or a portion of the material of the second portion of the handle component 720 to form the vent port 724b. The disclosed subject matter can form the vent port 724a and/or vent port 724b to have desired dimensions (e.g., length, width). The vent port 724a and/or vent port 724b can be formed in the respective portion(s) of the first portion of the handle component 718 and/or the second portion of the handle component 720 to create an opening(s) or path(s) (e.g., a secondary or alternate vent path(s)) between the back cavity 712 and the outside of the sensor device 702 to enable desirable equalization or control of pressure (e.g., pressure equalization) on either side of the diaphragm component 714.

The sensor device 702 also can comprise a vent component 726a, which can include a set of vents 728a, and/or vent component 726b, which can include a set of vents 728b. The vent component 726a can be associated with the vent port 724a and/or the vent component 726b can be associated with the vent port 724b. For example, the set of vents 728a can be disposed over the vent port 724a, and/or the set of vents 728b can be disposed over the vent port 724a. In some embodiments, the vent component 726a can comprise a vent handle component that can include a first portion of the vent handle component 730a and a second portion of the vent handle component 732a on which respective ends of the set of vents 728a can be placed (e.g., directly or indirectly placed) to suspend or dispose the set of vents 728a over the vent port 724a, wherein the vent handle component (e.g., 730a, 732a) can be formed (e.g., directly or indirectly formed) on a surface of the first portion of the handle component 718 in proximity to the vent port 724a. Alternatively or additionally, the vent component 726b can comprise a vent handle component that can include a first portion of the vent handle component 730b and a second portion of the vent handle component 732b on which respective ends of the set of vents 728b can be placed (e.g., directly or indirectly placed) to suspend or dispose the set of vents 728b over the vent port 724b, wherein such vent handle component (e.g., 730b, 732b) can be formed (e.g., directly or indirectly formed) on a surface of the second portion of the handle component 720 in proximity to the vent port 724b. The vent handle component (e.g., 730a, 732a) associated with the vent component 726a and/or the vent handle component (e.g., 730b, 732b) associated with the vent component 726b can be formed from the same material or a different material (e.g., different insulator material) than the set of vents 728a and/or set of vents 728b. The disclosed subject matter can form (e.g., create) the set of vents 728a and/or set of vents 728b, the vent handle component (e.g., 730a, 732a) and/or the other vent handle component (e.g., 730b, 732b), and/or any other components of the vent component 726a and/or vent component 726b using a desired etching process, lithography process, drilling process, or other process to etch away or otherwise remove desired material(s) from layers of material of the respective vent stack structure(s) (e.g., stack of materials or layers that can etched or otherwise processed to form the respective components of the vent component 726a and/or the respective components of the vent component 726b). While the disclosed subject matter depicts the vent component 726a and vent component 726b as being located inside the sensor package on the back cavity side of the sensor device 702, in other embodiments, the disclosed subject matter can form the vent component 726a and/or vent component 726b on the acoustic port side of the sensor device 702, wherein the vent component 726a and/or vent component 726b can thereby be associated or integrated with the acoustic port 708. The vent port 724a and/or vent port 724b, vent component 726a and/or vent component 726b, and the set of vents 728a and/or set of vents 728b of the sensor device 702 of FIG. 7 can function the same or essentially the same as the vent port 124, vent component 126, and set of vents 128, respectively, of the sensor device 102 of FIG. 1.

The sensor device 702 further can include a PAL resistance component 734a that can be placed in or integrated with the vent port 724a, and/or PAL resistance component 734b that can be placed in or integrated with the vent port 724b. It is noted that the exploded view of the vent port 724a is depicted without showing the PAL resistance component 734a to better illustrate the vent port 724a as it can be structured when formed (e.g., by an etching process, lithography process, drilling process, or other desired material removal process of the disclosed subject matter) and prior to implementation of the PAL resistance component 734a with respect to the vent port 724a. Each of the PAL resistance component 734*a* and/or PAL resistance component 734*b* can be or can comprise a filter component and/or a membrane component that can have a desirably high acoustic resistance and/or a desirably small pore size, and/or a desirable liquid-resistant and/or particle resistant coating (e.g., hydrophobic coating or superhydrophobic coating), which can be applied to the filter component and/or the membrane component. In some embodiments, additionally or alternatively, the desirable liquid-resistant and/or particle resistant coating can be applied to the set of vents 728*a* of the vent component 726*a* and/or the set of vents 728*b* of the vent component 726*b*. The PAL resistance component 734*a* and/or PAL resistance component 734*b* of the sensor device 702 of FIG. 7 can be the same as or substantially the same as the PAL resistance component 134 of the sensor device 102 of FIG. 1. Each of the PAL resistance component 734*a* and/or the PAL resistance component 734*b*, utilizing the filter component and/or membrane component, and/or the liquid-resistant and/or particle resistant coating can inhibit or prevent, or at least effectively prevent, liquid and particles from entering the back cavity 712 without degradation to performance of the sensor device 702 (e.g., without reducing SNR or increasing THD of the sensor device 702).

The sensor device 702, employing the vent port 724*a* and/or vent port 724*b*, the vent component 726*a* and/or vent component 726*b*, and the PAL resistance component 734*a* and/or PAL resistance component 734*b*, can be configured or designed to achieve a desired frequency response, including a desired low frequency corner of the frequency response, of the sensor device 702. In some embodiments, the sensor device 702, employing the vent port 724*a* and/or vent port 724*b*, the vent component 726*a* and/or vent component 726*b*, and the PAL resistance component 734*a* and/or PAL resistance component 734*b*, can be configured or designed to achieve the desired frequency response, including the desired low frequency corner of the frequency response, in conjunction with the known acoustic resistance of the PAL resistance component 734*a* and/or PAL resistance component 734*b* (e.g., the acoustic resistance of the filter component, membrane component, and/or hydrophobic coating).

Figure 8:
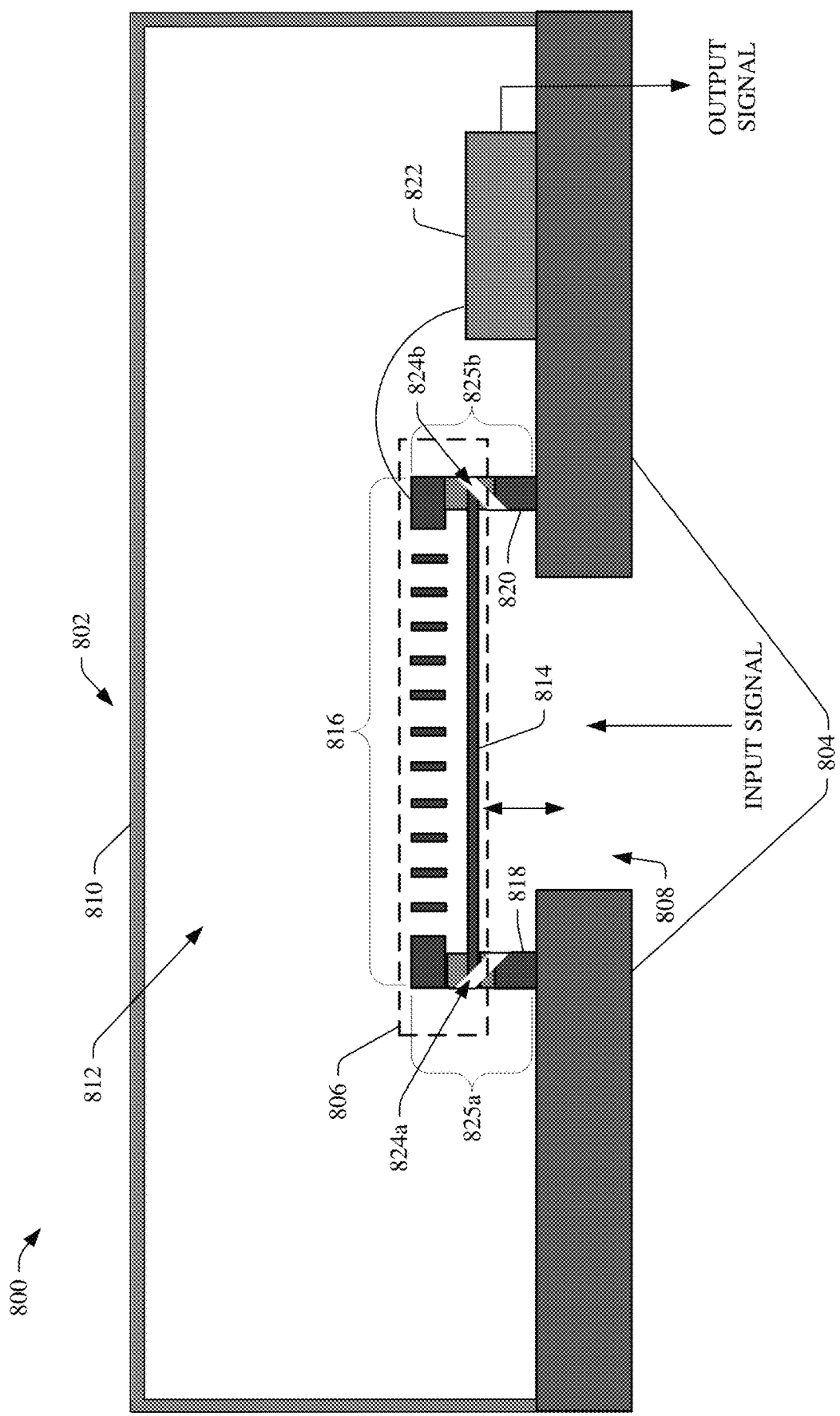
FIG. 8 illustrates a cross-sectional diagram of another example system that can form an alternate venting path in, at least in part, a handle component of a sensor device, in a sensor device, in accordance with various aspects and embodiments of the disclosed subject matter.

FIG. 8 illustrates a cross-sectional diagram of another example system 800 that can form an alternate (e.g., secondary) venting path in, at least in part, a handle component of a sensor device, in a sensor device, in accordance with various aspects and embodiments of the disclosed subject matter. The system 800, by employing the alternate venting path formed in, at least in part, the handle component, can facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter. The system 800 can be substantially the same as the system 100 of FIG. 1 and system 700 of FIG. 7, except that the system 800 can have a vent port formed in, in part, the handle component, as well as in portions of other components of a stack structure, of the sensor device to form an alternate venting path in the sensor device.

The system 800 can comprise a sensor device 802 that can be or can comprise a sensor assembly or sensor package that can comprise various components of the sensor device 802, such as more fully described herein. The sensor device 802 can comprise a substrate component 804, a sensor component 806, an acoustic port 808, a lid component 810, and a back cavity 812, wherein the sensor component 806 can comprise a diaphragm component 814 and a backplate component 816. The sensor device 802 also can comprise a handle component, which can include a first portion of the handle component 818 and a second portion of the handle component 820. The sensor device 802 further can comprise a circuit component 822. These respective components of the system 800 can be the same as or similar to, and/or can comprise the same or similar features or functionalities as, respective components (e.g., respectively named components), such as more fully disclosed herein. These respective components of the system 800 can be arranged in relation to each other as illustrated in FIG. 8 and as more fully described herein (e.g., with regard to system 100 of FIG. 1 or system 700 of FIG. 7).

In some embodiments, the sensor device 802 can include a vent port 824*a* and/or vent port 824*b* that can be formed in a desired portion of stack structure 825*a*, including a desired portion of the first portion of the handle component 818, and/or a desired portion of stack structure 825*b*, including a desired portion of the second portion of the handle component 820. The stack structure 825*a* and stack structure 825*b* can comprise various layers of materials, including, respectively, the first portion of the handle component 818 and the second portion of the handle component 820, respective ends of the diaphragm component 814, and respective ends of the backplate component 816, wherein the respective ends of the diaphragm component 814 can be portions of the diaphragm component 814 that are not disposed over, facing, or exposed to the acoustic port 808. In certain embodiments, the disclosed subject matter (e.g., employing a processor and various tools or processes controlled by the processor) can utilize an etching process, lithography process, drilling process, or other desired process to etch away or otherwise remove the portion of the respective materials of the stack structure 825*a* to form (e.g., create) the vent port 824*a* and/or the portion of the respective materials of the stack structure 825*b* to form vent port 824*b*. The disclosed subject matter can form the vent port 824*a* and/or vent port 824*b* to have desired dimensions (e.g., length, width). The vent port 824*a* and/or vent port 824*b* can be formed in the respective portion(s) of the stack structure 825*a* and/or the stack structure 825*b* to create an opening(s) or path(s) (e.g., a secondary or alternate vent path(s)) between the back cavity 812 and the outside of the sensor device 802 to enable desirable equalization or control of pressure (e.g., pressure equalization) on either side of the diaphragm component 814, as more fully described herein.

For reasons of brevity and clarity, the system 800 does not explicitly reference a vent component(s), including a set(s) of vents and a vent handle component(s), and a PAL resistance component(s). However, in some embodiments, the sensor device 802 can comprise one or more vent components, each including a set of vents and a vent handle component, and one or more PAL resistance components, that can be respectively associated with the vent port 824*a* and/or vent port 824*b* in a same or similar manner as more fully described herein (e.g., with regard to the sensor device 702 of FIG. 7).

Figure 9:
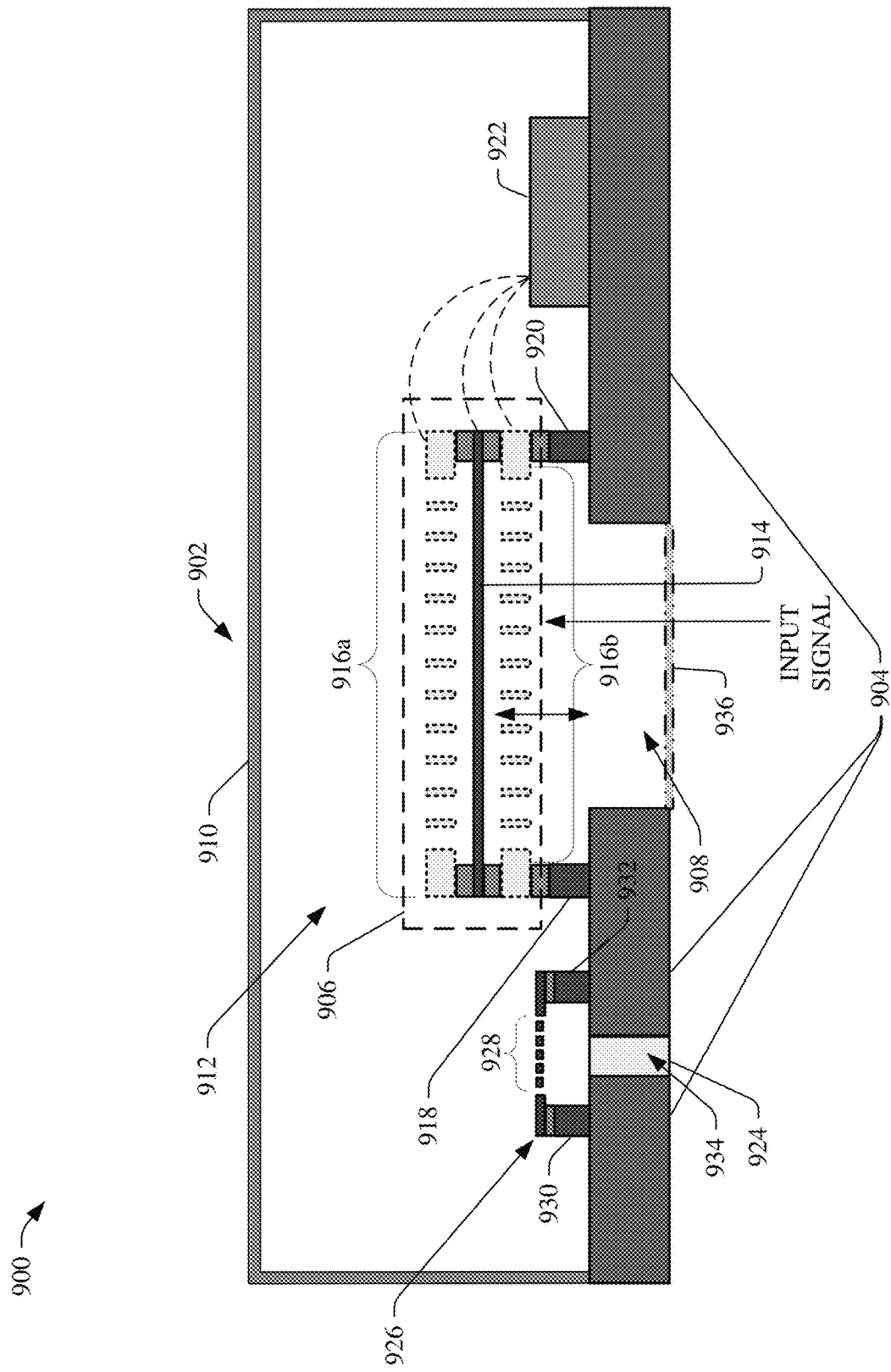
FIG. 9 depicts a cross-sectional diagram of an example system that can employ an alternate venting path, formed via a vent port with an integrated vent component, in a sensor device, containing no back plate component or comprising one or more backplate components, to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter.

FIG. 9 depicts a cross-sectional diagram of an example system 900 that can employ an alternate (e.g., secondary) venting path, formed via a vent port with an integrated vent component, in a sensor device, containing no back plate component or comprising one or more backplate components, to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter. The system 900 can be substantially the same as the system 100 of FIG. 1, except that the system 900 optionally can comprise no backplate component, or can comprise one or more (e.g., two) backplate components.

The system 900 can comprise a sensor device 902 that can be or can comprise a sensor assembly or sensor package that can comprise various components of the sensor device 902, such as described herein. The sensor device 902 can comprise a substrate component 904 (e.g., substrate), a sensor component 906, an acoustic port 908, a lid component 910, and a back cavity 912. In accordance with various embodiments, the sensor component 906 can comprise a diaphragm component 914 and optionally can contain no backplate component or can include one or more backplate components, such as backplate component 916a and/or backplate component 916b. If employed in the sensor device 902, the backplate component 916a can be located within the back cavity 912 in proximity to (e.g., within a desired defined distance of) the diaphragm component 914. If employed in the sensor device 902, the backplate component 916b can be located on the acoustic port side of the diaphragm component 914 in proximity to the diaphragm component 914 and between the opening of the acoustic port 908 and the diaphragm component 914. Whether the sensor component 906 contains no backplate component, comprises one backplate component (e.g., backplate component 916a or backplate component 916b), or comprises more than one backplate component (e.g., backplate component 916a and backplate component 916b) can depend on the type of sensor desired, the sensor characteristics desired for the sensor device, and/or other factors relating to the design of the sensor device.

The sensor device 902 also can comprise a handle component, which can include a first portion of the handle component 918 and a second portion of the handle component 920. The sensor device 902 further can comprise a circuit component 922 and a vent port 924. The sensor device 902 also can include a vent component 926, which can comprise a set of vents 928 and a vent handle component that can include a first portion of the vent handle component 930 and a second portion of the vent handle component 932 on which respective ends of the set of vents 928 can be placed (e.g., directly or indirectly placed) to suspend or dispose the set of vents 928 over the vent port 924. The sensor device 902 further can comprise a PAL resistance component 934 that can be placed (e.g., inserted) in or integrated with the vent port 924.

These respective components of the system 900 can be the same as or similar to, and/or can comprise the same or similar features or functionalities as, respective components (e.g., respectively named components), such as more fully disclosed herein. These respective components of the system 900 can be arranged in relation to each other as depicted in FIG. 9 and as more fully described herein (e.g., with regard to system 100 of FIG. 1).

In some embodiments, the sensor device 902 can comprise (e.g., optionally can comprise) a port cover component 936 that can be associated with (e.g., attached or adhered to, or integrated with) the substrate component 904 to cover the acoustic port 908 and protect the diaphragm component 914 from objects (e.g., particles) that may try to enter the acoustic port 908. The port cover component 936 can, for example, comprise a mesh structure with holes of desired (e.g., suitable or optimal) size and shape that can allow acoustic signals or waves to pass through the port cover component 936 to enter the acoustic port 908 and interact with the diaphragm component 914 without undesired (e.g., unacceptable) degradation or disruption of the acoustic signals or waves as they enter the acoustic port and/or without undesired (e.g., unacceptable) degradation or disruption of the performance of the diaphragm component 914 and the sensor device 902 overall. The disclosed subject matter can drill holes in the port cover component 936 or otherwise can remove material from the port cover component 936 to form the holes in the port cover component 936. The port cover component 936 can be formed using a one or more desired materials, which can comprise a conductive material and/or a non-conductive material.

In some embodiments, additionally or alternatively, if the vent port 924 is sufficiently designed (e.g., using a desired combination of a filter (e.g., PIF), MEMS vent structure, and/or coating (e.g., hydrophobic coating)), as desired, the port cover component 936 can be or can comprise a relatively low resistance filter (e.g., a very low resistance PIF) that can be placed over the acoustic port 908 for the purpose of preventing larger particles from entering the acoustic port 908 and contacting the diaphragm component 914, wherein such relatively low resistance filter will not substantially reduce (e.g., degrade) the performance of the sensor device 902.

In accordance with various embodiments of the disclosed subject matter, components (e.g., substrate component, sensor component, circuit component, vent component, PAL resistance component, handle component, and/or other component) of a system can be situated or implemented on a single integrated circuit (IC) die or chip. An IC chip can be a complementary metal-oxide-semiconductor (CMOS) chip, for example. In accordance with various other embodiments, the components of the system can be implemented on an ASIC chip. In accordance with still other embodiments, the components of the system can be situated or implemented on multiple IC dies or chips. For example, the vent component and/or vent port (e.g., alternate or secondary vent port) can be implemented on the same die or chip as the sensor component or can be implemented on another die or chip than the die or chip on which the sensor component is implemented.

It is to be appreciated and understood that, in accordance with various aspects and embodiments of the disclosed subject matter, respective features described herein with regard to a particular drawing of the disclosed subject matter can be implemented with other respective features, or as an alternative to other respective features, described herein with regard to another particular drawing of the disclosed subject matter. As a non-limiting example, the disclosed subject matter can implement the integrated vent component, e.g., vent component 426 integrated with the vent port 424 of the system 400 of FIG. 4, in other embodiments of a sensor device, wherein, e.g., an integrated vent component can be integrated with a vent port (e.g., vent port 524) that can be formed in another component (e.g., lid component 510) of a sensor device. As another non-limiting example, as desired, the disclosed subject matter can implement first vent features (e.g., vent port 124 formed in substrate component 104, vent component 126, and/or PAL resistance component 134) along with second vent features (e.g., vent port 524 formed in lid component 510, vent component 526, and/or PAL resistance component 534) (and/or other vent features) in a sensor device.

The aforementioned devices and/or systems have been described with respect to interaction between several components. It should be appreciated that such systems and components can include those components or sub-components specified therein, some of the specified components or sub-components, and/or additional components. Sub-components could also be implemented as components coupled to and/or communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 10:
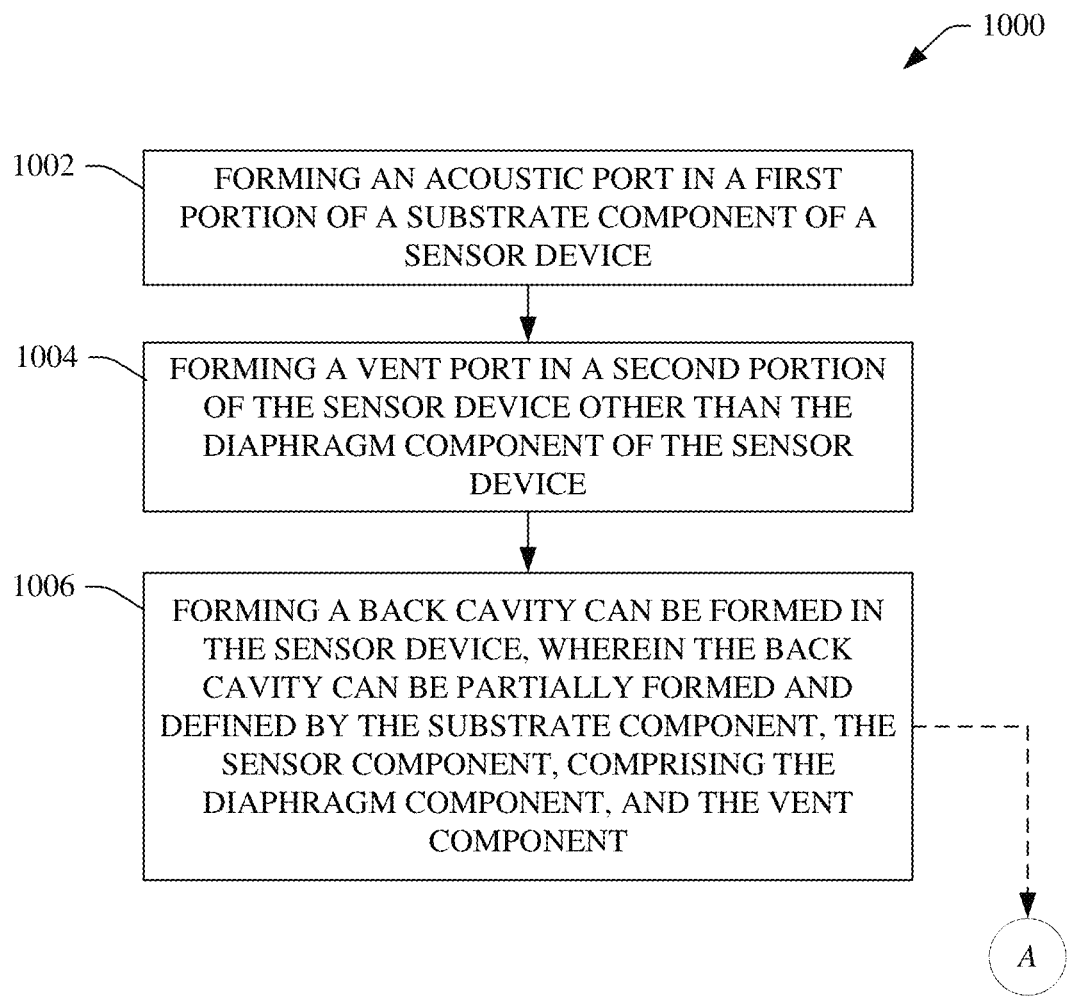
FIG. 10 illustrates a flow diagram of an example method that can form an alternate vent path in a sensor device to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter.
Figure 11:
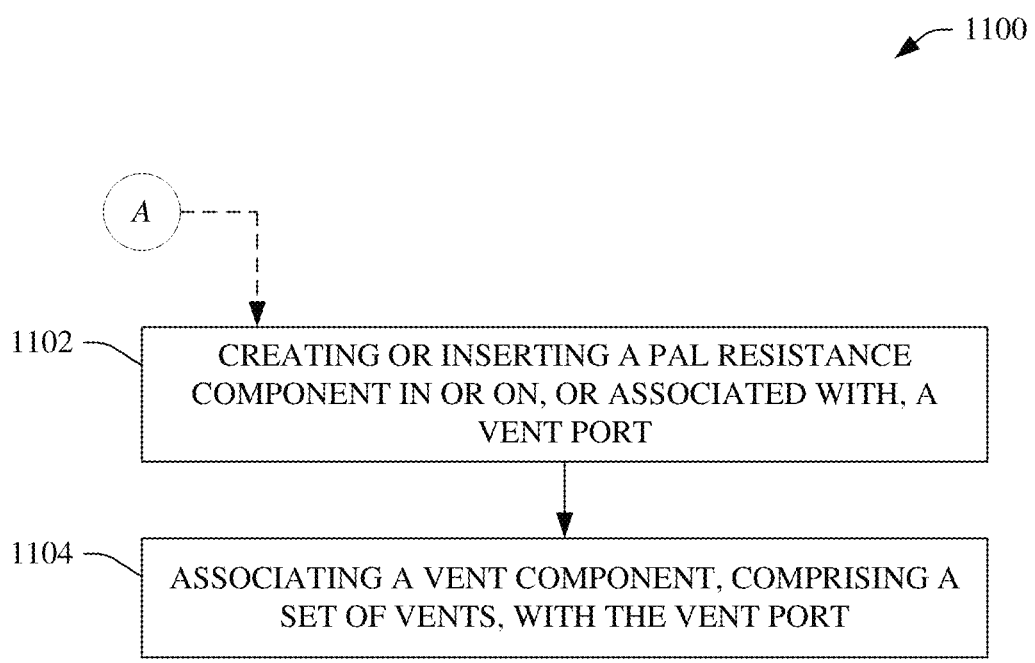
FIG. 11 depicts a flow diagram of an example method that can form or implement a particle-and-liquid resistance component and a vent component that can be associated with an alternate vent path of a sensor device to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter.

FIGS. 10-11 illustrate methods and/or flow diagrams in accordance with the disclosed subject matter. For simplicity of explanation, the methods are depicted and described as a series of acts. It is to be understood and appreciated that the subject disclosure is not limited by the acts illustrated and/or by the order of acts, for example acts can occur in various orders and/or concurrently, and with other acts not presented and described herein. Furthermore, not all illustrated acts may be required to implement the methods in accordance with the disclosed subject matter.

Referring to FIG. 10, illustrated is a flow diagram of an example method 1000 that can form an alternate (e.g., secondary) vent path in a sensor device to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter. The method 1000 can be implemented, for example, by a system or device comprising a sensor component, and/or a processor and associated memory (e.g., data store), wherein the processor can control or facilitate controlling formation or fabrication of the sensor device, including the alternate venting path.

At 1002, an acoustic port can be formed in a first portion of a substrate component of a sensor device. The disclosed subject matter (e.g., employing a processor and associated memory) can form the acoustic port in the first portion of the substrate component of the sensor device.

At 1004, a vent port can be formed in a second portion of the sensor device other than the diaphragm component of the sensor device. The disclosed subject matter (e.g., employing a processor and associated memory) can form the vent port in the second portion of the sensor device other than the diaphragm component. For example, the disclosed subject matter can form one or more vent ports, comprising the vent port, in one or more of the substrate component, a lid component, a circuit component (e.g., ASIC), or a handle component of the sensor device, as more fully described herein.

At 1006, a back cavity can be formed in the sensor device, wherein the back cavity can be partially formed and defined by the substrate component, the sensor component, comprising the diaphragm component, and the vent component. The disclosed subject matter (e.g., employing a processor and associated memory) can form the back cavity, wherein the back cavity can be formed or defined by the substrate component, the sensor component, the lid component the circuit component, the handle component, and/or another component of the sensor device, as more fully described herein. The vent port can provide a venting path that can facilitate equalization of pressure associated with the diaphragm component, as more fully described herein.

In some embodiments, the method 1000 can proceed to reference point A. In certain embodiments, method 1100 of FIG. 11 can proceed from reference point A to form or insert a PAL resistance component in the vent port formed in the second portion of the sensor device other than the diaphragm component and/or form a vent component that can be disposed over, integrated with, or otherwise associated with the vent port.

Turning to FIG. 11, depicted is a flow diagram of an example method 1100 that can form or implement a PAL resistance component and a vent component that can be associated with an alternate (e.g., secondary) vent path of a sensor device to facilitate providing desirable pressure equalization for the sensor device while preventing or at least desirably inhibiting liquids or particles from entering a back cavity of the sensor device and providing desirable performance, including desirable frequency response, of the sensor device, in accordance with various aspects and embodiments of the disclosed subject matter. The method 1100 can be implemented, for example, by a system or device comprising a sensor component, and/or a processor and associated memory (e.g., data store), wherein the processor can control or facilitate controlling formation or fabrication of the sensor device, including the alternate venting path, a PAL resistance component, and a vent component. In some embodiments, the method 1100 can proceed from reference point A of the method 1100 of FIG. 11.

At 1102, a PAL resistance component can be created or inserted in or on, or associated with, the vent port. The disclosed subject matter (e.g., employing a processor and associated memory) can create the PAL resistance component in or on, insert the PAL resistance component in, or otherwise associated the PAL resistance component with the vent port. The PAL resistance component can comprise, for example, a membrane component (e.g., a porous membrane) and/or a filter component that can inhibit, resist, or impede liquids or particles (e.g., liquids or particles outside the sensor device) from entering the back cavity of the sensor device via the vent port, as more fully described herein.

At 1104, a vent component, comprising a set of vents, can be associated with the vent port. The disclosed subject matter (e.g., employing a processor and associated memory) can associate the vent component with the vent port to facilitate providing a desirable venting of air via the alternate vent path (e.g., via the vent port) and facilitate desirable pressure equalization with respect to both sides of the diaphragm component (e.g., the back cavity side and the acoustic port side of the diaphragm component). In some embodiments, the disclosed subject matter can create the vent component to be located inside the sensor package and disposed over the vent port such that air traveling between the vent port and back cavity can pass through the vents of the vent component. In other embodiments, the disclosed subject matter can create the vent component to be integrated with the vent port, wherein air traveling between the vent port and back cavity can pass through the vents of the vent component. As desired, in certain embodiments, the disclosed subject matter can treat or process the vent component, including the set of vents, and/or the PAL resistance component (e.g., the membrane component, if it is used) with a desired liquid-resistant and/or particle resistant coating that can inhibit or prevent, or at least effectively prevent, liquid and particles from entering the back cavity via the vent port. The desired liquid-resistant and/or particle resistant coating can be or can comprise a hydrophobic or superhydrophobic coating, for example.

It is to be appreciated and understood that components (e.g., sensor component, diaphragm component, backplate component, substrate component, lid component, handle component, vent handle component, circuit component, PAL resistance component, vent component, acoustic port, and/or vent port, . . . ), as described with regard to a particular device, system, or method, can comprise the same or similar functionality as respective components (e.g., respectively named components or similarly named components) as described with regard to other devices, systems, or methods disclosed herein.

Although the description has been provided with respect to particular embodiments thereof, these particular embodiments are merely illustrative and not restrictive.

While particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As used in this application, the terms "component," "system," "interface," and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

In another example, respective components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

What has been described above includes examples of aspects of the disclosed subject matter. It is, of course, not possible to describe every conceivable combination of components or methods for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A device, comprising:
a substrate component, wherein an acoustic port is formed in a first portion of the substrate component;
a sensor component comprising a diaphragm component disposed over the acoustic port;
a handle component disposed between the diaphragm component and the substrate component, wherein the diaphragm component spans from a first handle portion of the handle component across the acoustic port to a second handle portion of the handle component, and wherein the diaphragm component is configured to contain no hole; and
a vent component that is associated with a vent port formed in a second portion of the device other than the diaphragm component, wherein the device comprises a back cavity that is partially formed and defined by the substrate component, the sensor component, and the vent component, wherein the vent port provides a vent path that facilitates an equalization of pressure associated with the diaphragm component, wherein the vent component comprises a Microelectromechanical Systems (MEMS) structure that is integrated with the vent port and associated with the vent path, wherein the vent path is an only vent path to the back cavity,
wherein the sensor component has a sensing directionality that is based on a group of characteristics of the vent component and the vent port, and wherein the group of characteristics comprise the MEMS structure that is integrated with the vent port.

2. The device of claim 1, wherein the sensor component comprises at least one of a MEMS sensor, an acoustic sensor, a directional sensor, a cardioid sensor, a capacitive sensor, or a piezo sensor.

3. The device of claim 1, wherein the sensor component has a gradient response frequency corner or a pressure gradient response of a frequency response that is controlled, determined, or defined based on the group of characteristics comprising the MEMS structure of the vent component, a number and a size of vents of the vent component, an amount of an acoustic resistance of the vent port or the vent component, a distance between the vent port and the diaphragm component, or a location of the vent port and the vent component in relation to the diaphragm component, the location being in the second portion of the device other than the diaphragm component.

4. The device of claim 1, wherein the vent path facilitates pressure equalization between the back cavity and an external environment that is external to a sensor assembly component comprising the substrate component, the sensor component, the handle component, or the vent component.

5. The device of claim 1, wherein the diaphragm component is between and adjacent to the back cavity and the acoustic port, and wherein a first side of the diaphragm component faces and partially defines the back cavity and a second side of the diaphragm component is opposite to the first side and faces the acoustic port.

6. The device of claim 1, wherein, to facilitate attaining the sensing directionality or a directional response of the sensor component, the directional response, a sensing pattern, or a directional pickup pattern of the sensor component is controlled, determined, or defined based on an acoustic resistance level of the vent component and a location of the vent port and the vent component in relation to the diaphragm component, the location being in the second portion of the device other than the diaphragm component.

7. The device of claim 6, wherein the vent port is a first vent port, wherein the location is a first location, wherein at least one of a second vent port or a housing component is located in the second portion of the device other than the diaphragm component, and wherein, to facilitate the controlling, the determining, the defining, or attaining of the sensing directionality or the directional response, the sensing pattern, the directional pickup pattern of the sensor component, or an amount of acoustic delay in the sensor component is controlled, determined, or defined based on a first distance between the first vent port and the diaphragm component, a second distance between a second vent port and the diaphragm component, or a second location of the housing component in relation to the diaphragm component, the first vent port, or the second vent port.

8. The device of claim 1, further comprising a particle-and-liquid resistance component that comprises a porous membrane component or a filter component that is associated with the vent port and inhibits at least one of a liquid or a particle from entering the back cavity via the vent port.

9. The device of claim 8, wherein the vent component or the porous membrane component is treated with a hydrophobic coating or a superhydrophobic coating to facilitate inhibiting at least one of the liquid or the particle from entering the back cavity via the vent port.

10. The device of claim 8, wherein the particle-and-liquid resistance component is disposed over or integrated with the vent port.

11. The device of claim 8, wherein the diaphragm component, by spanning from the first handle portion of the handle component across the acoustic port to the second handle portion of the handle component and by containing no hole, prevents at least one of a liquid or a particle from entering the back cavity via the acoustic port and the diaphragm component.

12. The device of claim 1, wherein the vent component, comprising the MEMS structure, is in a location that is in the second portion of the device other than the diaphragm component and the acoustic port.

13. The device of claim 1, further comprising:
a lid component that is associated with the substrate component; and
a circuit component that is associated with the sensor component, wherein the lid component, the substrate component, the vent component, the diaphragm component, the circuit component, and the handle component are arranged in relation to each other to form or define the back cavity.

14. The device of claim 13, wherein one or more vent ports, comprising the vent port, are formed in at least one of the substrate component, the lid component, the circuit component, or the handle component.

* * * * *